(12) United States Patent
Kohno et al.

(10) Patent No.: US 6,952,110 B2
(45) Date of Patent: Oct. 4, 2005

(54) TESTING APPARATUS FOR CARRYING OUT INSPECTION OF A SEMICONDUCTOR DEVICE

(75) Inventors: Ryuji Kohno, Chiyoda (JP); Hideo Miura, Koshigaya (JP); Masatoshi Kanamaru, Miho (JP); Hiroya Shimizu, Ryugasaki (JP); Hideyuki Aoki, Takasaki (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/934,046

(22) Filed: Sep. 3, 2004

(65) Prior Publication Data

US 2005/0032252 A1 Feb. 10, 2005

Related U.S. Application Data

(63) Continuation of application No. 10/274,422, filed on Oct. 17, 2002.

(30) Foreign Application Priority Data

Oct. 17, 2001 (JP) ......................................... 2001-318814

(51) Int. Cl.⁷ .............................................. G01R 31/02
(52) U.S. Cl. ...................................... 324/757; 324/754
(58) Field of Search ................................ 324/754–758, 324/761–762, 765; 439/482, 820, 824

(56) References Cited

U.S. PATENT DOCUMENTS

| | | | | | |
|---|---|---|---|---|---|
| 4,961,052 A | * | 10/1990 | Tada et al. | .................. | 324/754 |
| 5,412,329 A | * | 5/1995 | Iino et al. | .................... | 324/754 |
| 5,434,513 A | * | 7/1995 | Fujii et al. | ................... | 324/765 |
| 5,521,522 A | * | 5/1996 | Abe et al. | .................... | 324/758 |
| 5,555,422 A | * | 9/1996 | Nakano | ...................... | 324/754 |
| 6,507,204 B1 | * | 1/2003 | Kanamaru et al. | .......... | 324/754 |

* cited by examiner

Primary Examiner—Minh N. Tang
(74) Attorney, Agent, or Firm—Townsend and Townsend and Crew LLP

(57) ABSTRACT

A method of manufacturing a semiconductor device has forming process for forming a semiconductor device on a major surface of a wafer, and testing process for testing defect of the semiconductor device. The testing process includes bringing a testing apparatus into contact with test electrodes of the semiconductor device. The testing apparatus has a contactor including probes that come into contact with the test electrodes of the semiconductor device, and secondary electrodes electrically connected to the probes and disposed on a surface opposite to the probes; and a substrate on which electrodes electrically communicated to the contactor by a conducting device. The conducting device is so formed that stress applied to the conducting device in the state where the probes are in contact with the test electrodes is larger than stress applied to the conducting device in the state where the probes are not in contact with the test electrodes.

4 Claims, 22 Drawing Sheets

TESTING APPARATUS FOR CARRYING OUT INSPECTION OF A SEMICONDUCTOR DEVICE

CROSS-REFERENCES TO RELATED APPLICATIONS

This application is a continuation of U.S. patent application Ser. No. 10/274,422, filed on Oct. 17, 2002, which claims priority to Japanese Patent Application No. 2001-318814, filed on Oct. 17, 2001, both of which are incorporated by reference herein for all purposes.

BACKGROUND OF THE INVENTION

The present invention relates to a method of manufacturing a semiconductor device, and more specifically to a method of manufacturing a semiconductor device wherein the testing process of the semiconductor device is simplified and made efficient.

In the process of manufacturing semiconductor devices, especially for a testing apparatus used in the testing process, JP-A-7-7052 discloses a testing apparatus using probes for measuring electrical properties fabricated by forming a metal film for conduction on a surface of cantilever structures consisting of single crystal silicon, and holding these by an insulating substrate whereon a conductive wiring pattern is formed. JP-A-2001-56344 discloses a testing apparatus, in which film state probe units forming plural wires on sheet state materials have a plurality of rectangular probe regions in a matrix state, and each of the probe units is fixed on a single substrate. JP-A-2001-7165 discloses a testing apparatus comprising an insulator board, and a probe card wafer consisting of the same material as the wafer to be measured and having a plurality of bumps disposed thereon, and the probe card wafer has a spacer for sealing between the wafer to be measured and the probe card wafer, and a wafer through-hole for vacuum suction in order to vacuum suctioning the wafer to be measured.

However, by the constitution disclosed in JP-A-7-7052, if the number of probes is to be increased, it becomes difficult to secure the region for forming each wiring. This is because the wiring must run from the probes (protrusions) of the cantilever, pass on the plane (surface) whereon the probes are formed, and reach secondary electrodes formed on an circumferential side of the substrate (e.g., single crystal silicon) that forms the probes, and must detour other wiring or elements present in the course.

Although the constitution wherein a large number of probes are disposed is disclosed in JP-A-2001-56344 or JP-A-2001-7165, no structures intending good contact or conduction as a whole even if there are warps and the like in the substrate and the wafer are disclosed; and no specific methods for supporting and fixing each probe unit to the substrate are also disclosed.

For example, if positional accuracy is thus relatively insufficient between probe units, troubles that the probes cannot come into contact with the pads of the wafer to be tested may be caused. Also in the structure wherein each probe unit is always substantially fixed to a single substrate, the manufacturing costs of the substrate for constituting the entire structure may become enormous. In addition, for example, if malfunction occurs in one wiring in the wiring system from the probes to the external system, all of wiring must be replaced for the nature of the testing apparatus, and enormous costs are required for the repair thereof. Furthermore, when a wide area in the wafer of a large area (diameter) is to be covered, the warps of the substrate and the wafer cannot be absorbed, and defects in function, that uniform contact cannot be performed at specific places, may occur.

An object of the present invention is to solve such problems, and to provide a method of manufacturing a semiconductor device that can manufacture the semiconductor device easily and efficiently by disposing a sufficient number of probes to cover a whole wide area, such as the entire area of a wafer to be tested, and carrying out a semiconductor testing process that can bring the probes into good contact with the wafer to be tested.

SUMMARY OF THE INVENTION

The present invention relates to a method of manufacturing a semiconductor device having a forming process for forming a semiconductor device on a major surface of a wafer, and a testing process for testing the defect of the semiconductor device formed on the wafer, wherein the testing process comprises a step conducted by bringing a testing apparatus into contact with the test electrodes of the semiconductor device, the testing apparatus having a plurality of contactor units having a plurality of contactors comprising a plurality of probes that come into contact with the test electrodes of the semiconductor device to be tested, and secondary electrodes electrically connected to the probes and disposed on a surfaces opposite to the probes; a substrate whereon electrodes electrically communicated to the contactor units by a conducting device are formed; and a contactor-supporting member for accommodating the plurality of contactor units and supporting the contactor units in a region containing the circumferential ends of the contactor units; and is formed so as to allow the positional variation between the contactors and the contactor-supporting member when the contactor units are brought into contact with the semiconductor device to be tested.

The contactor-supporting member may support the contactor at, for example, outer end portions at a side of the surface having the probes of each contactor unit. It is also preferable that the contactor-supporting member inhibits the shift of the contactor unit in X- and Y-axial directions, and allows the movement in Z-axial direction. For example, the contactor unit may be supported with a so-called frame. Alternatively, the contactor-supporting member may have a beam across the contactor unit. The beam is preferably formed so as to position outside the region connecting the probes formed on the contactor unit and the corresponding through-holes. In the state where the probes are not in contact with the semiconductor device to be tested (wafer), a load that is smaller than the load required for conducting with the member in contact acts on the conducting device.

Specifically, for example, provided may be a plurality of contactor units each comprising a contactor comprising aggregate of the probes, aggregate of the secondary electrodes provided on a surface opposite to the surface whereon the aggregate of the probes are formed, and wiring for electrically connecting the probes to the secondary electrodes; and a pin bed furnished with aggregate of conducting members consisting of metal conductive part provided so as to align with the location of each secondary electrode of the contactor. Further, provided may be a positioning frame for specifying the relative position of each contactor unit, a substrate having a plurality of wiring layers, and a restraining means for specifying the relative position of the positioning frame and the substrate.

A contour of one contactor is formed so as to be smaller than a contour of the wafer to be tested.

For example, the contactor-supporting member is a frame structure that supports the contactor from the bottom, and allows its upward movement. The manufacturing method may include a step wherein each contactor or the contactor unit departs from the contactor-supporting member by coming into contact with the semiconductor device (wafer) to be tested.

Alternatively, a method of manufacturing a semiconductor device of the present invention has a forming process for forming a semiconductor device on a major surface of a wafer, and a testing process for testing the defect of the semiconductor device formed on the wafer, wherein the testing process has a plurality of contactor units having a plurality of contactors comprising a plurality of probes that come into contact with test electrodes of the semiconductor device to be tested, and secondary electrodes electrically connected to the probes and disposed on a surface opposite to the probes; a substrate whereon electrodes electrically communicated to the contactor units by a conducting device are formed; and the conducting device has a gap between the conducting device and the electrodes on the substrate or the secondary electrodes on the contactor in the state where the probes are not in contact with the semiconductor device to be tested; and communicate electrically the contactor to the substrate in the state where the probes are in contact with the semiconductor device to be tested.

In the conducting device, stress applied to the conducting device in the state where the probes are in contact with the test electrodes is larger than stress applied to the conducting device in the state where the probes are not in contact with the test electrodes.

The conducting device positions on the opposite side of the semiconductor with respect to the contactor, and is formed so that the stress applied to the conducting device in the state where the probes are in contact with the test electrodes is larger than the stress applied to the conducting device in the state where the probes are not in contact with the test electrodes.

Alternatively, in the method of manufacturing a semiconductor device, the conducting device is characterized by comprising a stress relaxation mechanism.

The conducting device comprises a mechanism to vary the length on its contour in response to the variation of the distance between the substrate and the contactor. Specifically, it can comprise an elastic body. For example, it may have a pogo pin or a spring probe. The conducting device can be disposed on the position corresponding to the secondary electrode.

Alternatively, in the method of manufacturing a semiconductor device, the testing apparatus has a supporting member for supporting the contactor-supporting member. The contactor-supporting member may also be accommodated in the frame.

Alternatively, the present invention relates to a method of manufacturing a semiconductor device having a forming process for forming a semiconductor device on a major surface of a wafer, and a testing process for testing the defect of the semiconductor device formed on the wafer, wherein the testing process comprises a step conducted by bring a testing apparatus into contact with the test electrode of the semiconductor device, the testing apparatus having a plurality of contactor units each having a contactor comprising a plurality of probes that come into contact with the test electrodes of the semiconductor device to be tested, and secondary electrodes electrically connected to the probes and disposed on a surface opposite to the probes; the secondary electrodes or through-holes corresponding to first probes formed on the outer end of the contactor unit being disposed on the first location relative to the first probes; and the secondary electrodes or through-holes corresponding to second probes formed inner than the first probes being disposed on the second location relative to the second probes.

In the method of manufacturing a semiconductor device, the through-holes or the secondary electrodes for the first probes are formed on one side with respect to the first probes or the opposite side of the contactor unit and a side adjacent to the outer end of the contactor unit, and the through-holes or the secondary electrodes for the secondary probes are disposed on both sides of the second probes.

Also in the method of manufacturing a semiconductor device, the testing apparatus may have a supporting member for supporting the contactor-supporting member, and the contactor-supporting member can be accommodated in the positioning frame. Thereby, positioning can be performed.

According to the present invention, there is provided a method of manufacturing a semiconductor device that can manufacture the semiconductor device easily and efficiently by disposing a sufficient number of probes to cover a whole wide area, such as the entire area of a wafer to be tested, and conducting a semiconductor testing process that can bring the probes into good contact with the wafer to be tested.

Also, there can be provided a testing apparatus that can easily repair the wiring system from the probe to an external system at a minimum unit, even if any trouble occurs in the wiring system due to an unexpected accident. The semiconductor device is tested and manufactured by applying the above described testing apparatus to the testing process, and consequently the testing process of the semiconductor device can be simplified and efficient and a testing cost can be reduced.

DETAILED DESCRIPTION OF THE INVENTION

Figure 1:
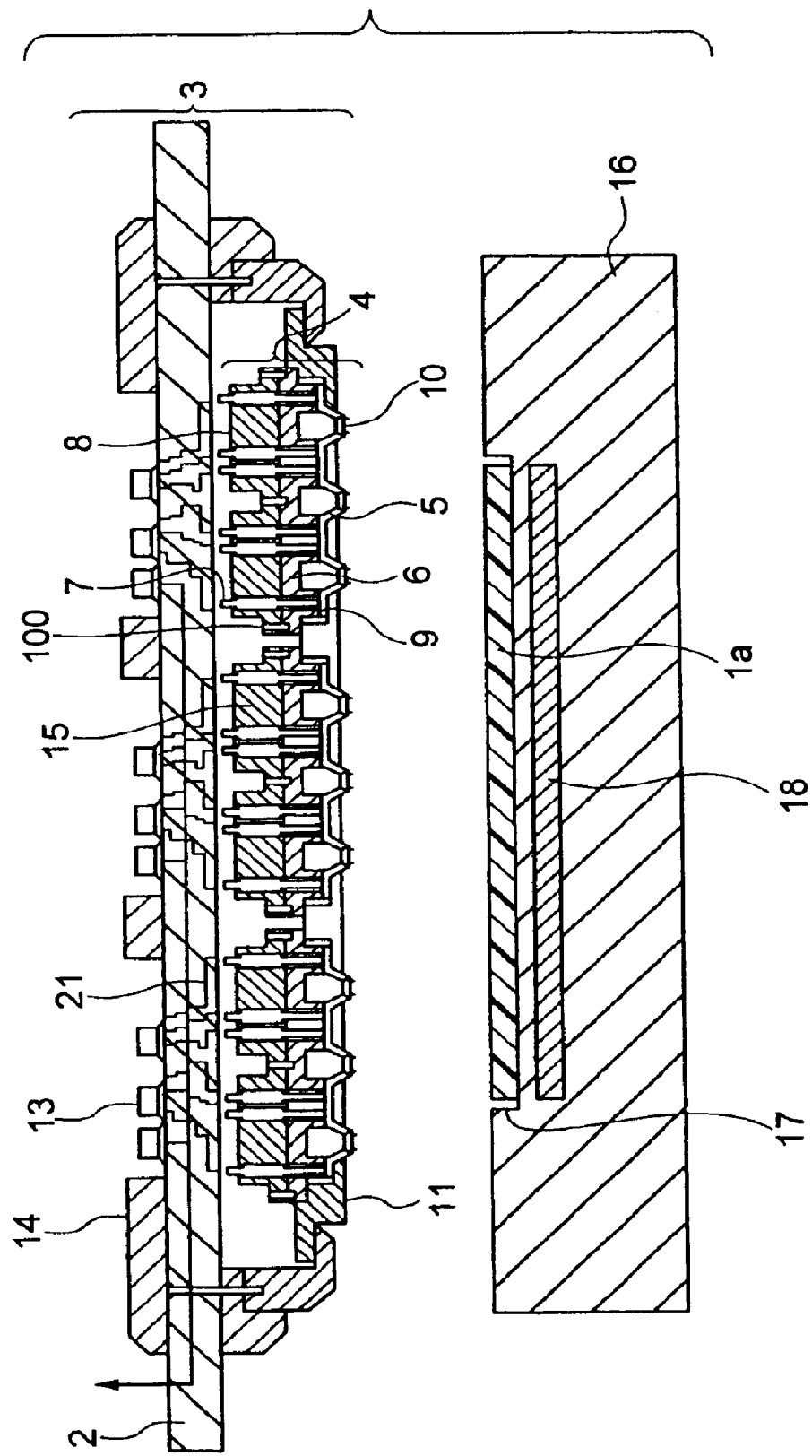
FIG. 1 is a schematic sectional view of a testing apparatus.

The embodiments of the present invention will be described below referring to the respective drawings.

First, a method of manufacturing a semiconductor device will be described briefly referring to the drawings.

The process of manufacturing a semiconductor device is roughly divided into a process for forming a large number of LSIs (hereafter described as chips although these are different in a narrow sense) on a wafer, known as a preliminary process; various testing processes for these chips; and an assembly process for assembling the chips into a final product. These steps will be described in detail below.

Figure 2:
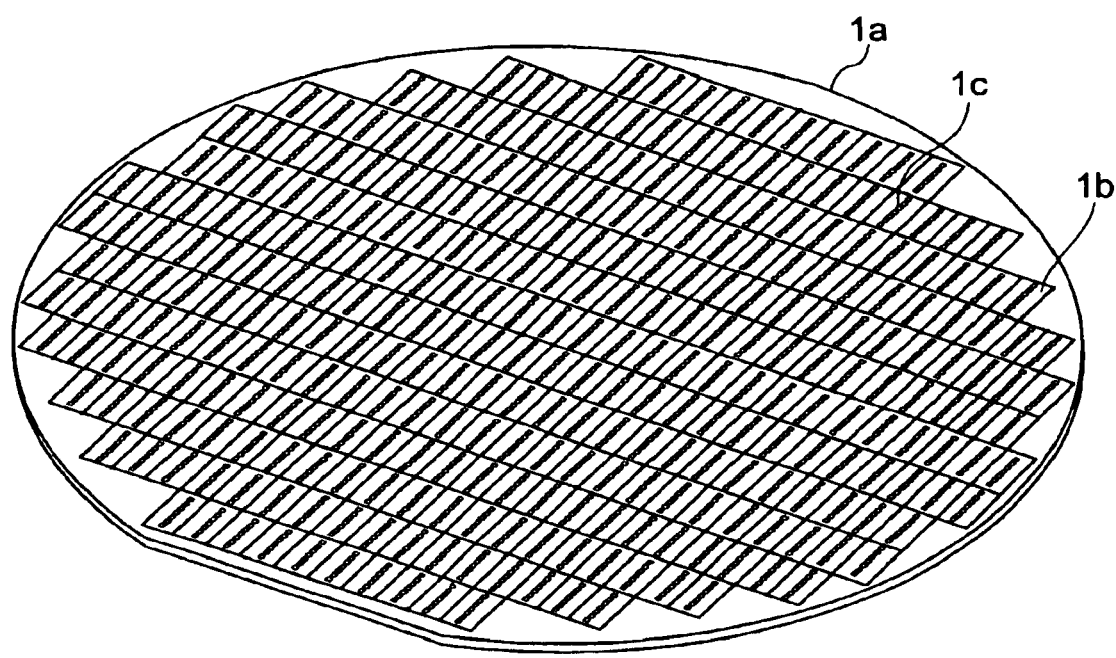
FIG. 2 is a diagram illustrating an example of a wafer to be tested.

The preliminary process will be described referring to FIG. 2. FIG. 2 is a diagram showing the appearance of a wafer in the state where chips have been formed. The preliminary process is a process for forming a large number of chips 1b on a surface of a silicon wafer 1a of a diameter of, for example, 20 or 30 cm. Although the preliminary process is further divided into a large number of steps, details thereof will be omitted here.

As a result of executing the preliminary process, several hundreds of chips 1b are formed on the surface of the wafer.

Here, a group of pads (electrodes) 1c for power source, grounding, and various signals are formed and disposed on the surface of each chip. The pads 1c will be described with reference to FIG. 3.

Figure 3:
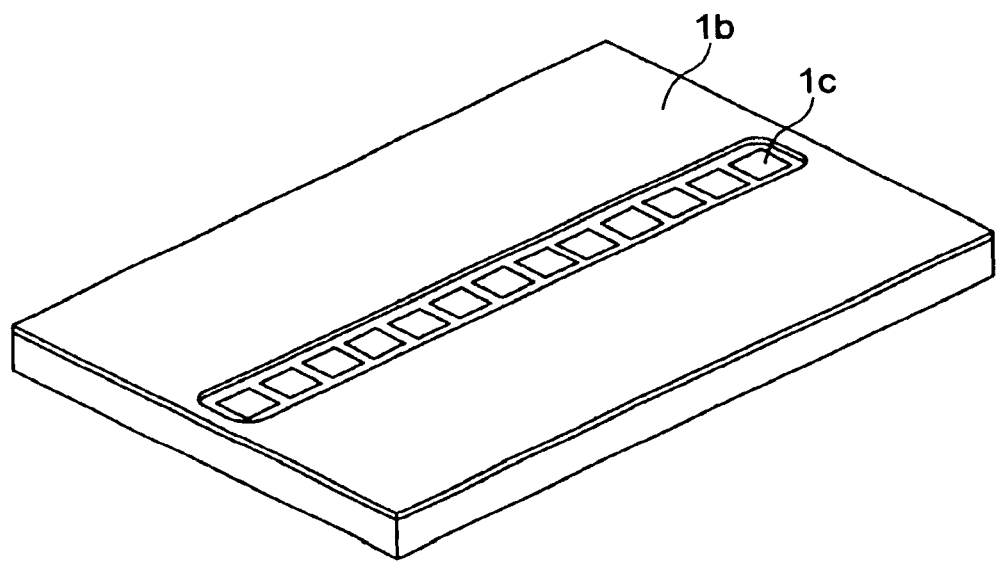
FIG. 3 is an enlarged view of a plurality of chips formed in the wafer.

FIG. 3 is an enlarged perspective view of one of the chips 1b shown in FIG. 2. In FIG. 3, each pad 1c is a part of the wiring in the chip 1b exposed on the surface, and a material of which main component comprises aluminum, gold or the like is normally used for the outermost layer. Length of a side of each pad 1c is several tens to a hundred and several tens of micrometers, and pitch between the pads is also several tens to a hundred and several tens of micrometers. These pads 1c are connected to external terminals of the semiconductor device as required in the stage of the following assembly process.

Figure 4:
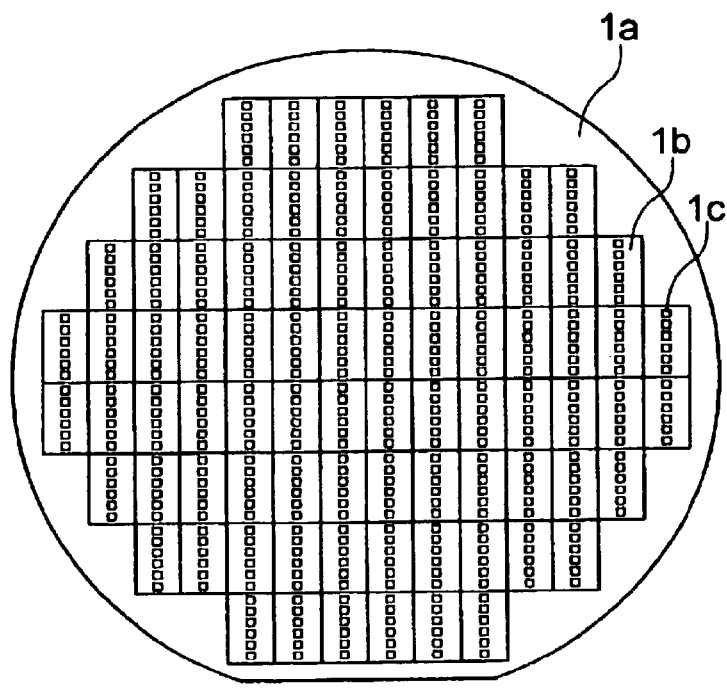
FIG. 4 is a diagram illustrating an example of chips similar to the chips shown in FIGS. 2 and 3.
Figure 5:
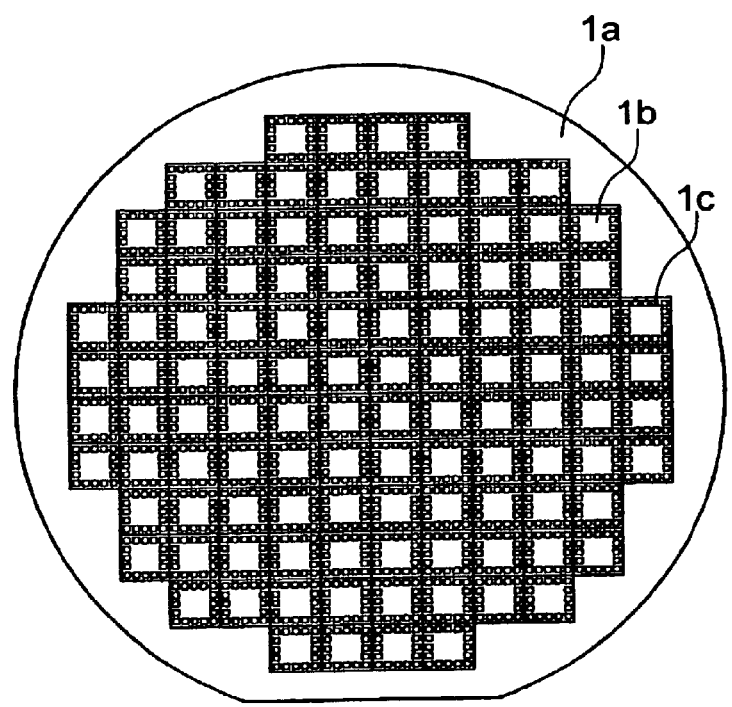
FIG. 5 is a diagram illustrating an example of chips having pads disposed on the circumference of each chip.

FIGS. 4 and 5 show examples of the layout of chips and pads in a wafer 1a. In the example of FIG. 4, a group of pads 1c are laid out substantially in line in the lengthwise direction of the chip 1b as in the same way as described using FIGS. 2 and 3. On the other hand, in the example of FIG. 5, pads 1c are laid out on the whole circumferential area of each chip 1b.

The testing process in a process for testing the fundamental properties and final actual properties of each chip 1b formed on the wafer 1a. This is also a step for acceleratively detecting the potential defects of chips 1b. From the stages, characteristics, or contents of the conducted test, these have various names such as the wafer test, selection, and burn-in. These testing steps are often conducted at as relatively high temperatures as 70° C. to 120° C.

The assembly process is a process for forming the structure and form as a product of a semiconductor device by cutting each chip 1b in the wafer 1a into individual units, and performing so-called assembly, such as joining to the lead frame, resin sealing of the circumference, and forming of the lead frame.

Although the testing process and the assembly process are described so as to be performed in this order, the order is not necessarily fixed due to the recent diversification of semiconductor device products, and for example, the order of the testing process and the assembly process may be reversed, or the order of fractionated steps described in the item of each process may be complicatedly intermixed.

FIG. 1 is a schematic sectional view of a testing apparatus used in the present invention. For simplicity, the numbers of, for example, probes and wiring is significantly reduced than actual numbers.

In FIG. 1, the testing apparatus 3 has a plurality of contactor units 4. Each contactor units 4 is constituted from a plurality of probes 10; secondary electrodes (not shown); a contactor 5, which is an aggregate of probes having wiring (not shown) for electrically connecting each probe 10 to each secondary electrode; an auxiliary plate 6, a pin bed 8 comprising a group of pogo pins 7 that coincident with the location of each secondary electrode, connectors 9 for each element, which are adhesives, screws, or the like.

A plurality of contactor units 4 are placed on a positioning frame 11, which is a contactor-supporting member, and the relative position (distance) thereof is determined. In some cases, the contactor units 4 are not only placed, but are mechanically fixed by, for example, magnetism, or by screws. Normally, each contactor unit 4 used has the same shape and the same constitution.

The positioning frame 11, which is a contactor-supporting member, is placed on a positioning-frame-supporting member 12, which is also a supporting member. The positioning-frame-supporting member 12 is preferably fixed to the substrate 2. The positioning frame 11 is disposed on the positioning-frame-supporting member 12 movably in the Z-axis direction (vertical direction), and the contactor unit 4 is disposed on the positioning frame 11 movably in the Z-axis direction (vertical direction).

Pads (not shown) are present on the locations coincident with each pogo pin 7 on the lower surface of the substrate 2, and are electrically connected to the upper surface of the substrate 2 through a multi-layer wiring 21 formed in the substrate 2. On the upper surface of the substrate 2, these are connected to capacitors, resistors, and other packaging elements. The wiring 21 receive them, and are finally extended to the circumferential portion of the substrate and to the pads for connecting them to external system (not shown).

A reinforcing plate 14 is joined to the upper surface of the substrate 2. The purpose thereof is to minimize warp produced in the substrate 2 due to load when the wafer to be tested 1a is brought into contact with the probes 10.

In the pin bed 8, pogo pins 7 in a casing 15 are constituted so as to have a proper amount of gap in the length and radial directions of the pogo pins 7. The group of pogo pins 7 is also constituted so as to have a proper amount of gap from a contact surface (pads) of the substrate 2 in the state before the test is conducted.

On the other hand, the wafer to be tested 1a is placed on a predetermined location of a wafer stage 16, which is a component in a wafer prober (not shown). A counter bore 17 of a thickness substantially the same as the thickness of the wafer 1a is formed in the wafer stage 16. Furthermore, a heater 18 for controlling the wafer 1a at a predetermined testing temperature is built in the wafer stage 16.

Next, procedures for assembling the testing apparatus, and for repairing a specific contactor (unit) will be described with reference to FIG. 6.

Figure 6:
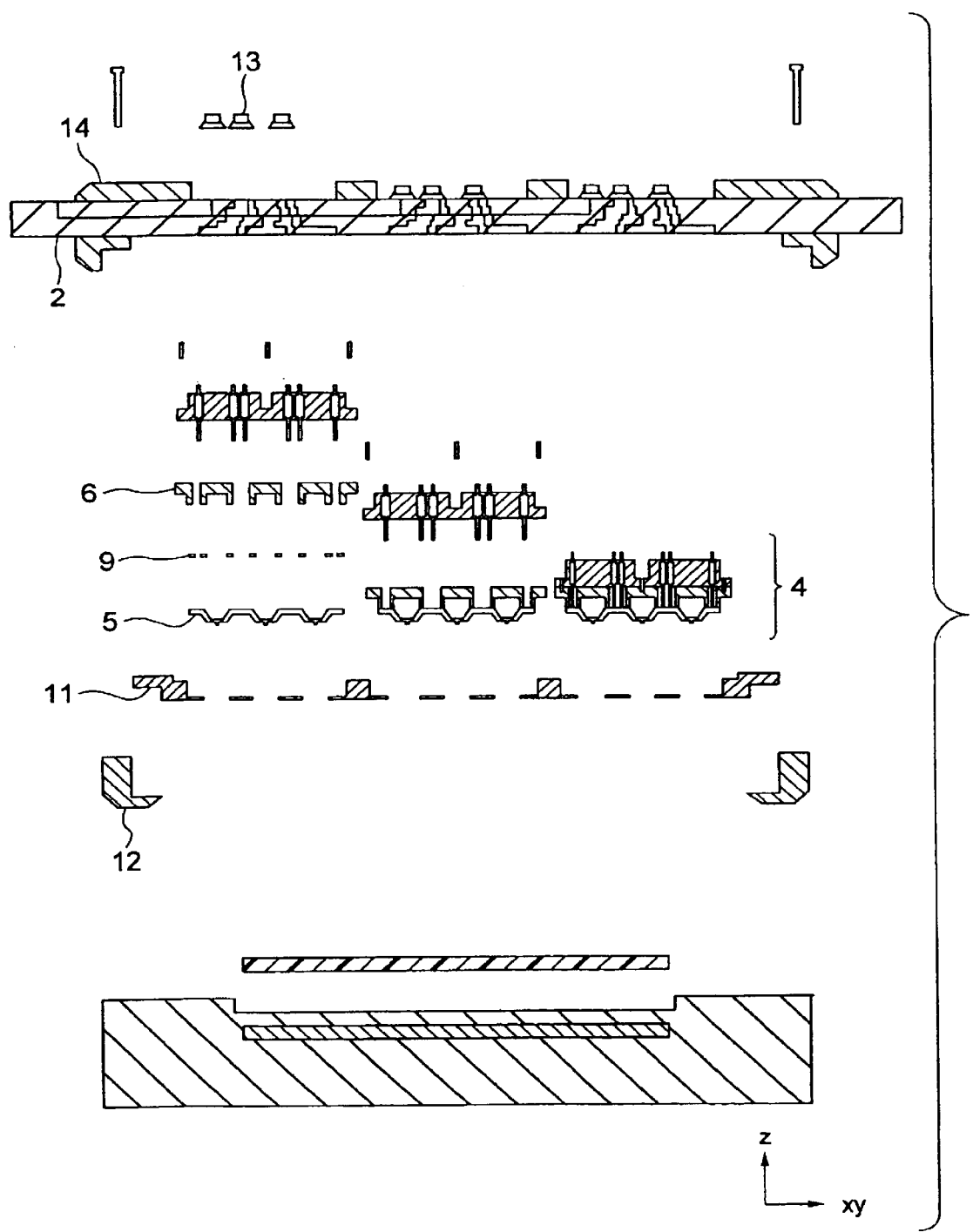
FIG. 6 is an exploded view of the testing apparatus shown in FIG. 1.

FIG. 6 is an exploded view of the testing apparatus shown in FIG. 1.

First, the assembly of the contactor unit 4 will be described.

In order to assemble the contactor unit 4, the contactor 5 is first bonded to the auxiliary plate 6 with an adhesive 9 taking care of the relative position in the x and y directions. As the adhesive 9, the adhesive having either thermosetting or thermoplastic properties can be used, and the adhesive having elastomeric characteristics after solidified may also be selected. Alternatively, there may be the case where a welding method is adopted to integrate the contactor 5 with the auxiliary plate.

Next, the pin bed 8 is bonded to the contactor 5 and the auxiliary plate 6 integrated togetherwith. This is preferably performed by screwing the both. Thereby, the fabrication of the contactor unit 4 is completed.

After fabricating a required number of contactor units 4, these are placed on the positioning frame 11 from above.

Next, the positioning frame 11 is placed on the positioning-frame-supporting structure 12 from above.

Next, the positioning-frame-supporting structure 12 is fixed to the substrate 2 with screws or the like from the bottom.

On the other hand, the reinforcing plate 14 has been joined to the substrate 2. Packaging parts 13 have also been mounted by soldering or the like.

Thereby, the assembly of the testing apparatus of the present invention is completed. The repair of a specific contactor unit 4 is also performed according to these procedures.

Figure 7:
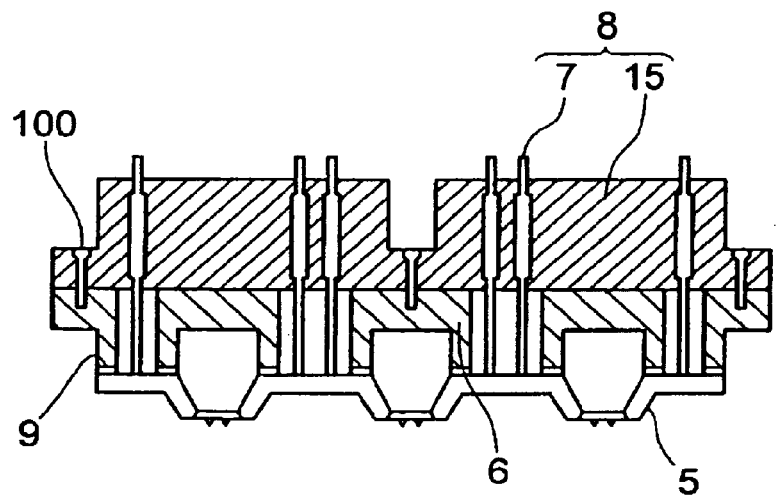
FIG. 7 is a schematic sectional view of a contactor unit used in the testing apparatus shown in FIG. 1.
Figure 8:
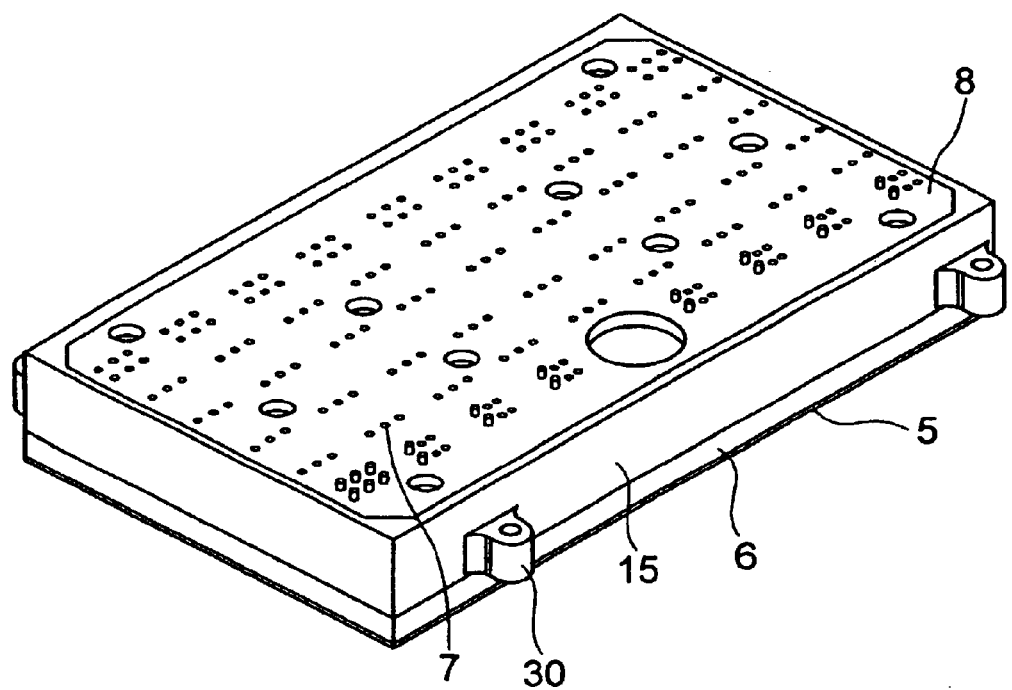
FIG. 8 is a perspective view of the contactor unit shown in FIG. 7.
Figure 9:
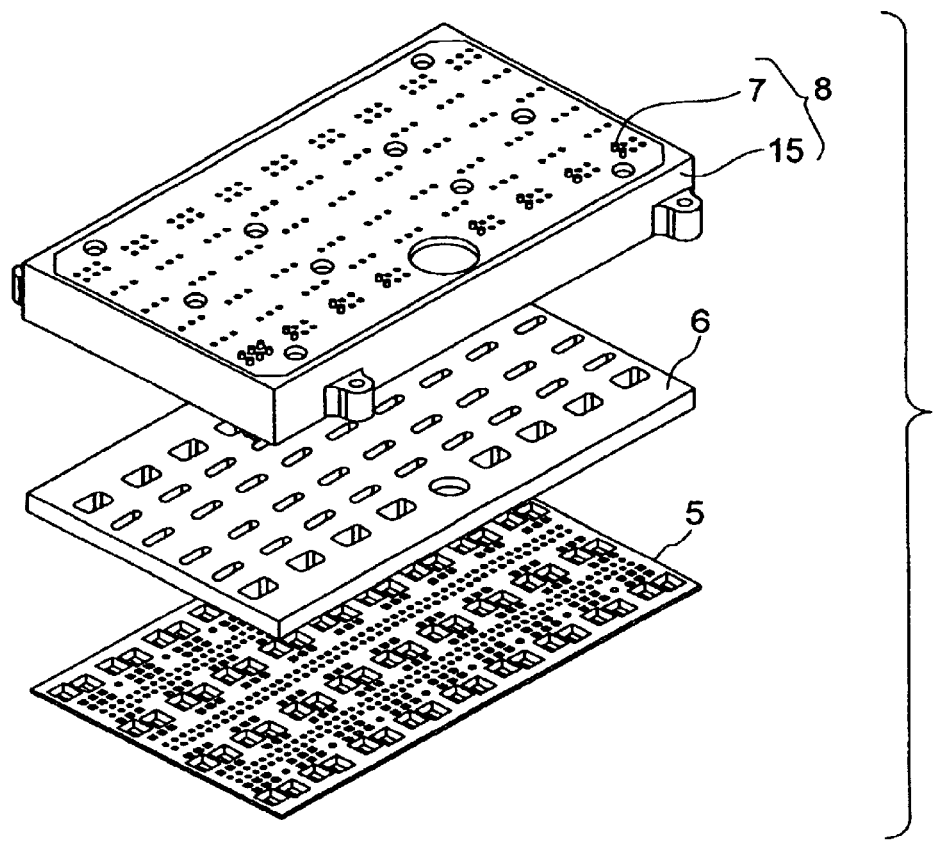
FIG. 9 is an exploded view of the contactor unit shown in FIG. 7.

FIGS. 7, 8, and 9 show an example of the specific form of the above-described contactor unit 4. FIG. 7 is a schematic sectional view of a contactor unit used in the testing apparatus of FIG. 1, FIG. 8 is a perspective view thereof, and FIG. 9 is an exploded view thereof.

The contactor unit 4 is connected to the pin bed 8 through the contactor 5 and the auxiliary plate 6. Here, as a typical form of the contactor unit 4, the auxiliary plate 6 is intervened between the contactor 5 and the pin bed 8. The auxiliary plate 6 is useful for the improvement of rigidity (reinforcement) of the contactor 5; the correction of warp unavoidably formed during the process of manufacturing the contactor 5 (planarization); and the securence of the space between the contactor 5 and the pin bed 8 for securing the protrusion of pogo pins 7 out of the casing 15. Therefore, as long as these can be satisfied substantially, the use of the auxiliary plate 6 may be eliminated by changing the casing 15 of the pin bed 8 to a form wherein the casing 15 and the auxiliary plate 6 are integrated togetherwith. Alternatively, the same measure may be applied to the contactor 5 to eliminate the use of the auxiliary plate 6.

Next, an example of contactors 5 will be described in detail.

Figure 10:
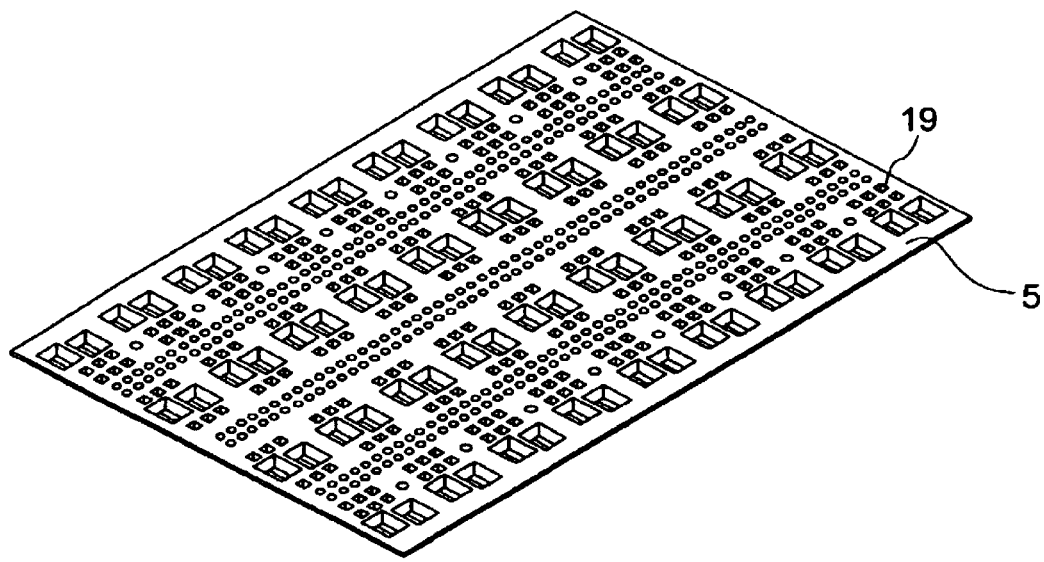
FIG. 10 is a perspective view of the contactor viewed from the upper surface direction.
Figure 11:
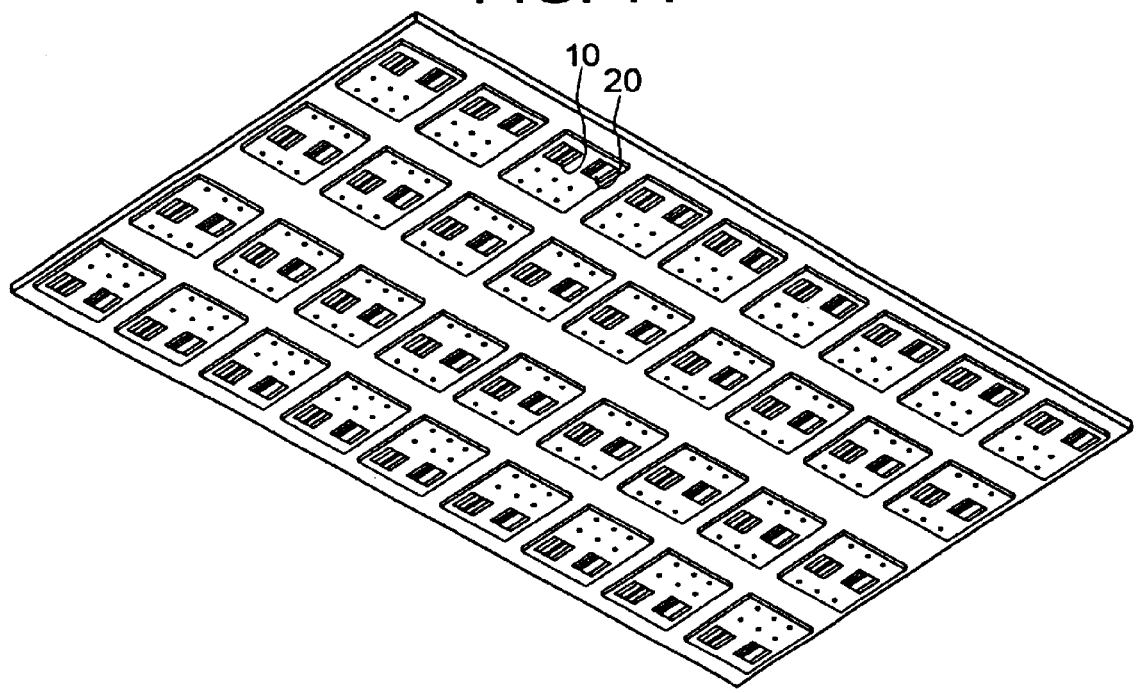
FIG. 11 is a perspective view of the contactor viewed from the lower surface direction.

FIG. 10 is a perspective view of the contactor 5 used in the present invention viewed from the upper surface direction, and FIG. 11 is a perspective view of the contactor 5 viewed from the lower surface direction.

The contactor 5 is formed by forming a plurality of probes 10 in a single silicon substrate (wafer) using an etching technique, and forming secondary electrodes on an opposite side of the surface whereon the probes 10 are formed, and wiring (not shown) for electrically connecting the both using plating and sputtering. Here, in order to connect the surface whereon the probes 10 are formed and the opposite surface with wiring, through-holes 19 are previously formed in the substrate of the contactor 5 so that wiring passes through each through-hole 19. Although the same number of wiring (that is, number of probes 10 or secondary electrodes) of through-holes 19 are formed here, a plurality of wiring can be passed through one through-hole 19, and for this purpose, there are many variations in the shape, number, and layout of the through-holes 19. Furthermore, when the through-holes 19 are formed using anisotropic etching, since the side walls thereof have theoretically a slope with a specific angle (see through-holes 19 in FIG. 10), and since a part of wiring are also laid on the slope as described above, the slopes can be seemed as secondary electrodes, and they can be laid out so as to insert pogo pins. Thereby, the advantages are obtained, in that since the need for forming secondary electrodes separately as FIG. 10 shows is eliminated, even when the layout space of the secondary electrodes cannot be secured sufficiently, connection to pogo pins becomes possible; and since the pogo pins are inserted with respect to the slopes, and the relative locations of the both are forcedly restrained. That is, they are self-aligned, the positioning becomes facilitated, resulting in the improvement of reliability of electrical connections.

In the contactor 5, wiring normally have a laminated structure consisting of a plurality of materials. They can be roughly divided into a base film formed by sputtering for improving adhesion between plated wiring and the silicon substrate; major wiring for obtaining as low resistance as possible; and a protective film for protecting the surface of wiring from oxidation or mechanical impact. The thickness of each film is preferably several tens of nm to several $\mu$m.

In the contactor 5 of the present invention, each probe 10 is normally formed on an independent beam. Each beam 20, probe 10, and the above-described through-hole 19 are three-dimensional structures obtained by etching the surrounding silicon substrate in the thickness direction. The dimensions thereof are roughly set as follows.

The width of the beam is determined to be a little smaller than the minimum distance of the pads to be contacted of the wafer to be tested. For example, when the minimum distance is 80 $\mu$m, the width is about 75 $\mu$m; and when the minimum distance is 150 $\mu$m, the width is about 140 $\mu$m. The thickness of the beam is several tens of micrometers. The length of the beam is determined from the width, the thickness and the load necessary for deflecting the beam to a predetermined amount. Normally, the length of the beam is about 0.5 mm to about 2 mm.

The height of the probes must be at least higher than the variation of individual heights unavoidably produced during the process of forming the probes. Ideally, the height is set to a value of the above-described variation of heights plus a desired deflection amount of the beam. Thereby, when the beam has deflected by the predetermined value, the major surface of the contactor 5 whereon the probe 10 is formed comes into contact with the wafer to be tested. As a result, if the pushing load given is larger than that value, the deflection of the beam always becomes constant. Therefore, the contact load of each probe 10 and the wafer to be tested is automatically controlled to a constant value, and the damage of the beam can be avoided without especially careful load control. The height of the probe that satisfies these is normally within a range between 10 $\mu$m and 50 $\mu$m.

The through-holes are formed so as to have a predetermined slope by means of anisotropic etching as described above. Thereby, the reliability of laying wiring (sputtering) in the direction of the thickness of the silicon substrate can be improved. As a result, the length of one side thereof is normally about 0.4 mm to about 1.0 mm in the largest portion. In the smallest portion on the opposite side, the minimum dimension thereof is determined under the condition that the wiring is securely connected to the both surfaces of the silicon substrate. Normally, the required length of one side is several tens of micrometers.

Although only the case where the contactor 5 is constituted using silicon as the base material, for example, an existing thin organic film, or a ceramic material can be substituted as the base material under the condition that they are integrated to the auxiliary plate in high accuracy.

Next, the details of the auxiliary plate will be described with reference to FIGS. 12 and 13.

Figure 12:
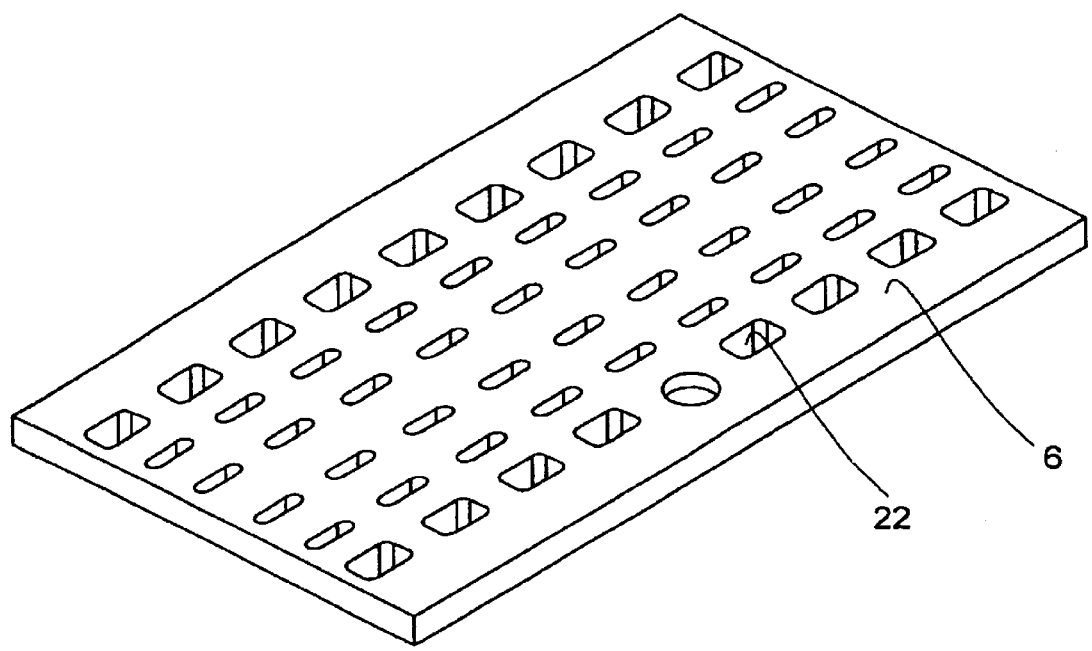
FIG. 12 is a perspective view of an auxiliary plate viewed from the upper surface direction.
Figure 13:
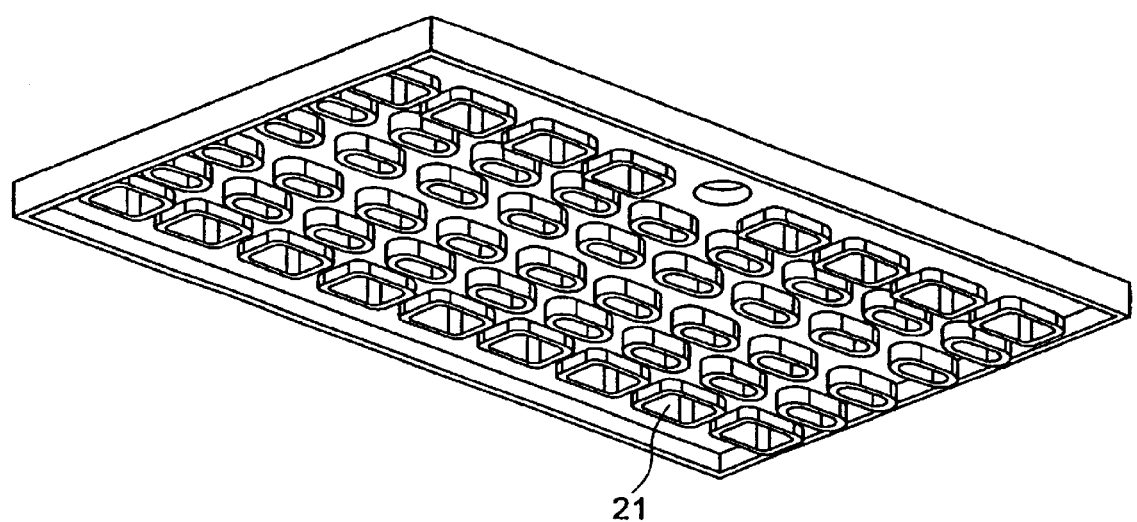
FIG. 13 is a perspective view of the auxiliary plate viewed from the lower surface direction.

FIG. 12 is a perspective view of the auxiliary plate viewed from the upper surface direction, used in the present invention, and FIG. 13 is a perspective view of the auxiliary plate viewed from the lower surface direction.

As is obvious from the drawings, the auxiliary plate 6 has a large number of through-holes 22. The through-holes 22 are measures for bringing the secondary electrodes of the contactor into contact with pogo pins through the auxiliary plate 6. In the example shown in FIGS. 12 and 13, the locations are laid out so that the pogo pins can be inserted into the through-holes 19 of the contactor 5 shown in FIGS. 10 and 11. In some layout of pogo pins, the through-holes 22 may be laid out so as to correspond to the locations of the secondary electrodes 26 shown in FIGS. 10 and 11.

When the base material of the contactor is silicon, it is preferable to match the coefficient of expansion of the auxiliary plate 6 to the coefficient of expansion of silicon. For this purpose, 42-nickel alloy, Pyrex glass, or the like can be used as the material. When the base material is 42-nickel alloy, the adoption of photo-fabrication is preferable as the manufacturing method, whereby the shape can be constituted at high accuracy. When this method is adopted, plural thin plates are thermo-compression bonded to obtain a thick plate. However, measures must be effected such as process in shape by which the wiring does not directly come into contact with the auxiliary plate 6 or insulation process of the surfaces of the wiring for the auxiliary plate 6 and the contactor so that the wiring of the contactor are not short-circuited. Also if a large number of contactor units are used in one testing apparatus so as to cover an entire large area, disadvantages that the positioning frame may be deflected due to the own weight thereof and the like occur. Therefore, it is desirable to make the auxiliary plate as light as possible to avoid such disadvantages. For this purpose, as is seen in FIG. 13, it is preferable to reduce the area of the portion 21 which directly comes into contact with the contactor, and to reduce the thickness of the other portions. Furthermore, since the auxiliary plate 6 also plays a role to flatten the warp of the contactor which is unavoidably formed during the process as described above, the flatness of the joining surface with the contactor should be taken care of.

Figure 15:
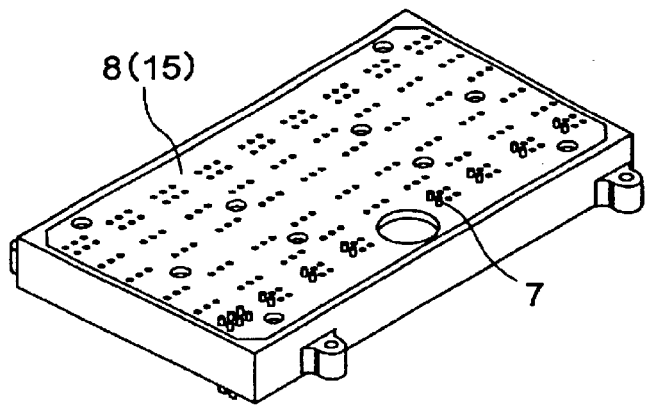
FIG. 15 is a perspective view of the pin bed shown in FIG. 14.
Figure 16:
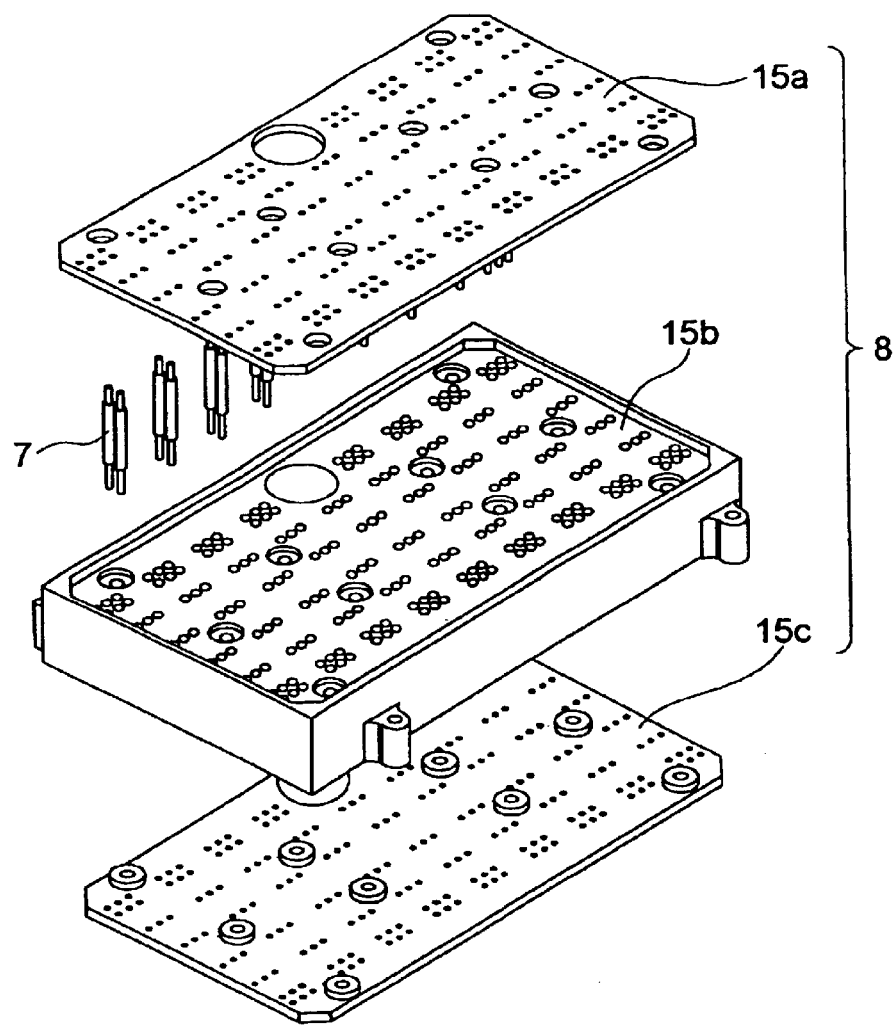
FIG. 16 is an exploded view of the pin bed shown in FIG. 14.

Next, the details of the pin bed will be described with reference to FIGS. 14, 15, and 16.

Figure 14:
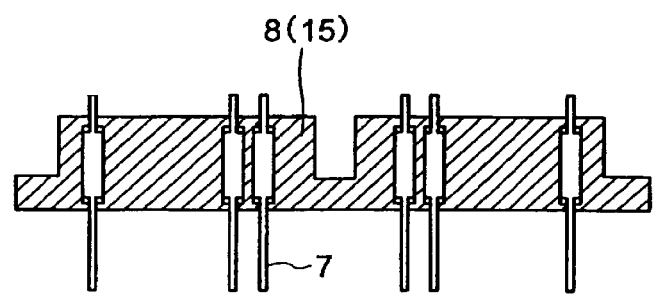
FIG. 14 is a schematic sectional view of a pin bed in the contactor unit used in the testing apparatus shown in FIG. 1.

FIG. 14 is a schematic sectional view of a pin bed in the contactor unit used in the testing apparatus shown in FIG. 1; FIG. 15 is a perspective view thereof; and FIG. 16 is an exploded view thereof.

As is obvious from the above description, the pin bed 8 is an interface part for electrically connecting the contactor to the substrate (in turn, to an external system). The pin bed 8 is composed of the pogo pins 7 and the casing 15. As specifically can be seen in FIG. 16, the casing 15 consists of three parts: an upper plate 15a, a main body 15b, and a lower plate 15c. These are often formed of molded resin. The main body 15b has a plurality of through-holes wherein a group of pogo pins 7 are inserted, and the upper plate 15a and the lower plate 15c having through-holes smaller than the through-holes of the main body 15b are fixed with screws from the top and the bottom thereof to prevent the fall of the pogo pins 7.

Although only the case where pogo pins 7 are used is described here, they can be substituted by metal pins integrally formed by, for example, a press depending on their costs and electric reliability or the like.

Next, the positioning frame will be described.

Figure 17:
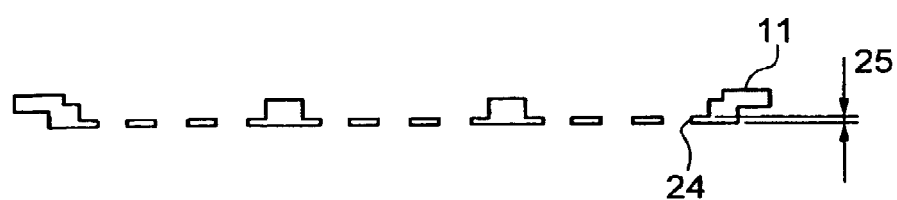
FIG. 17 is a schematic sectional view of a positioning frame used in the testing apparatus shown in FIG. 1.
Figure 18:
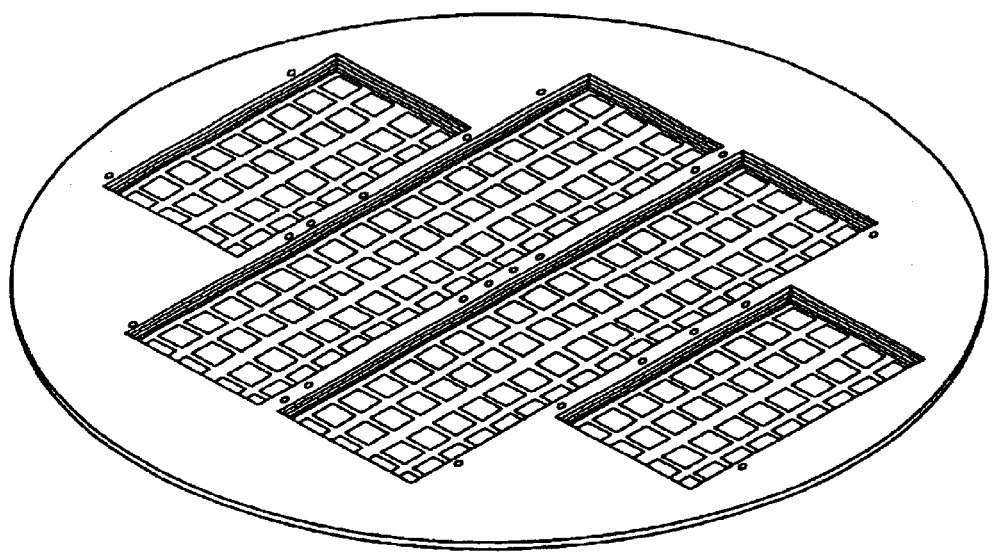
FIG. 18 is a perspective view of the positioning frame shown in FIG. 17 viewed from the upper surface direction.
Figure 19:
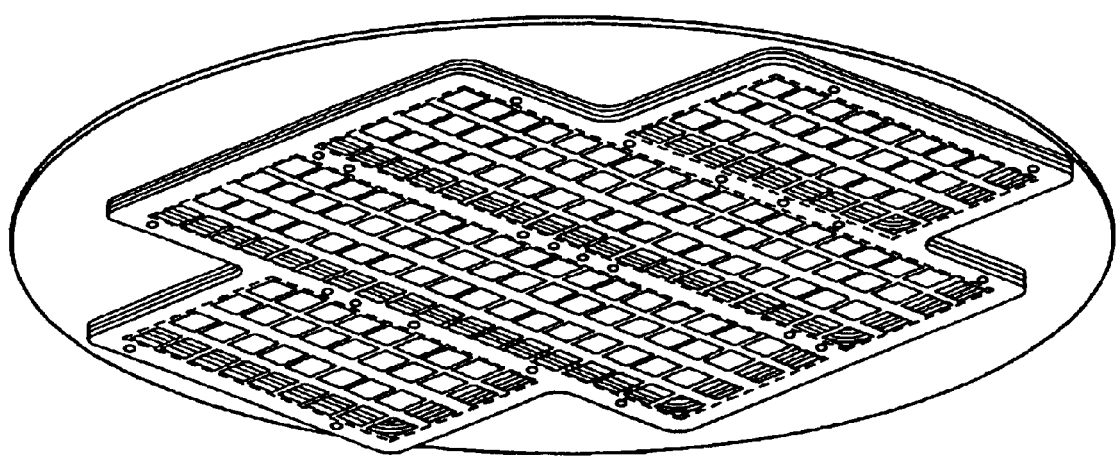
FIG. 19 is a perspective view of the positioning frame shown in FIG. 17 viewed from the lower surface direction.
Figure 20:
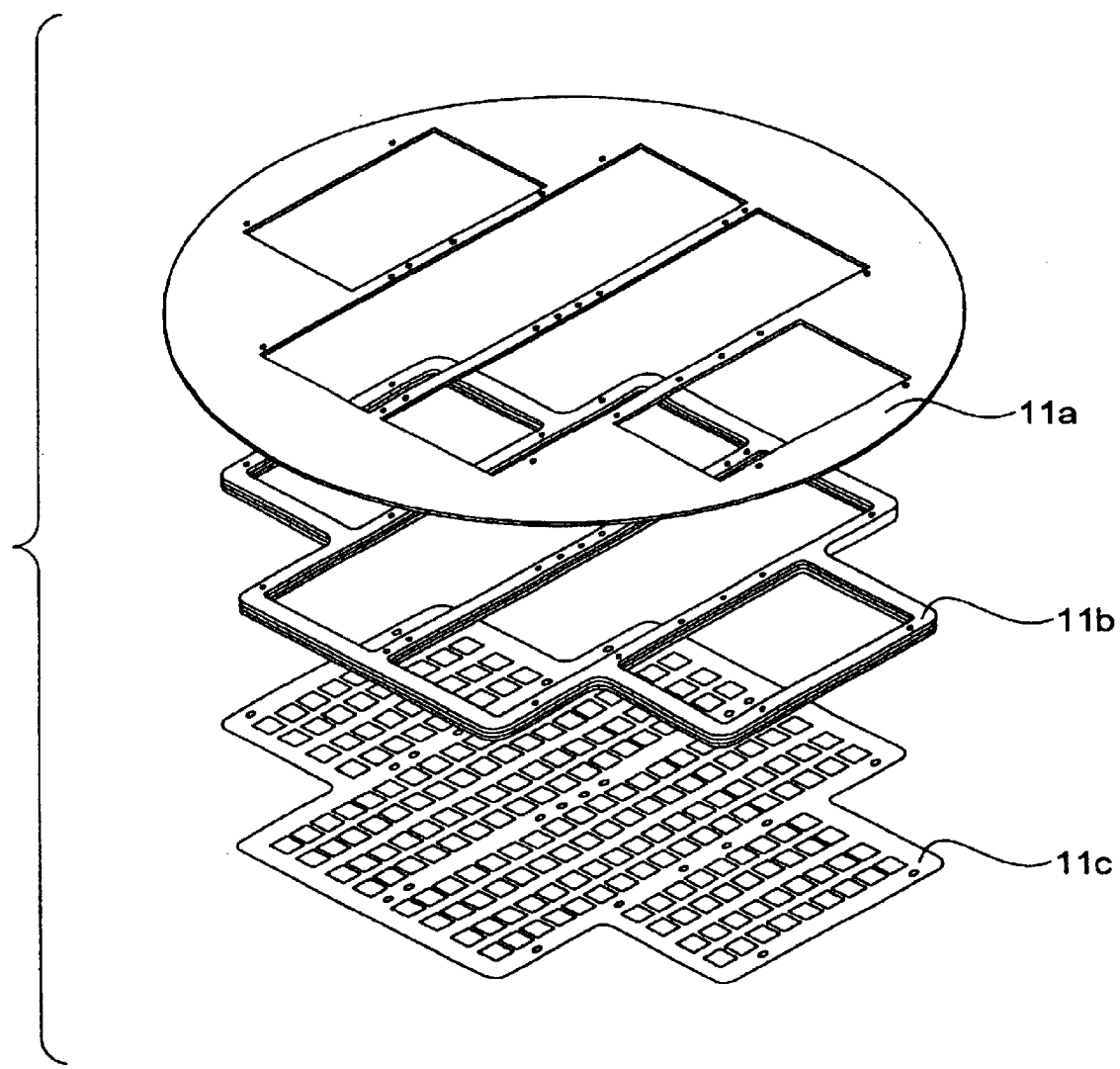
FIG. 20 is an exploded view of the positioning frame shown in FIG. 17.

FIG. 17 is a schematic sectional view of the positioning frame used in the testing apparatus shown in FIG. 1; FIG. 18 is a perspective view thereof viewed from the upper surface direction; FIG. 19 is a perspective view thereof viewed from the lower surface direction; and FIG. 20 is an exploded view thereof.

The positioning frame 11 is an important element for relatively positioning a plurality of contactors (units) so as to match the pad layout of the wafer to be tested. The positioning frame 11 has through-holes 24 having adequate dimensional accuracy to receive positioning edges (described later referring to FIG. 29) previously provided in the contactor. The plate thickness 25 of the portion for forming the through-holes 24 must be smaller than the height of the edge portion of the contactor so that it passes through the plate and is exposed on the surface of the testing apparatus. As a result, usually, the plate thickness 25 is significantly thinner than the circumference of the positioning frame 11. On the other hand, the circumference requires a considerable thickness for minimizing the deflection due to the own weight of the contactor unit as described above.

Thus, in order to realize the shape with locally different plate thickness and particularly requiring a considerable positional accuracy of the through-holes 24, the adoption of a manufacturing method using photo-application and thermo-compression bonding is effective. This will be described with reference to FIG. 20. A plurality of thin plates 11a, 11b, and 11c (or more) are fabricated using photo-fabrication (etching), and these are integrated by thermo-compression bonding.

It is preferable that the difference in thermal expansion produced by the temperature in the testing process between the positioning frame 11 and the wafer to be tested is as small as possible. This is in order to avoid the inconvenience wherein displacement occurs between the probes and the pads of the wafer to be tested due to the difference in thermal expansion, and they cannot come into contact with each other. Therefore, it is preferable to use 42-nickel alloy, which can adopt the above-described manufacturing method, and has a small difference in the coefficient of linear thermal expansion from the wafer to be tested (silicon).

Further, another measure to make the positioning frame 11 may be adopted in which sub-substrates of the same number as the contactor units are constituted and the contactor units are mounted on these sub-substrates and then, they can be mounted on the positioning frame 11 from the bottom. Thereby, the contactor units can be repaired easily.

Figure 21:
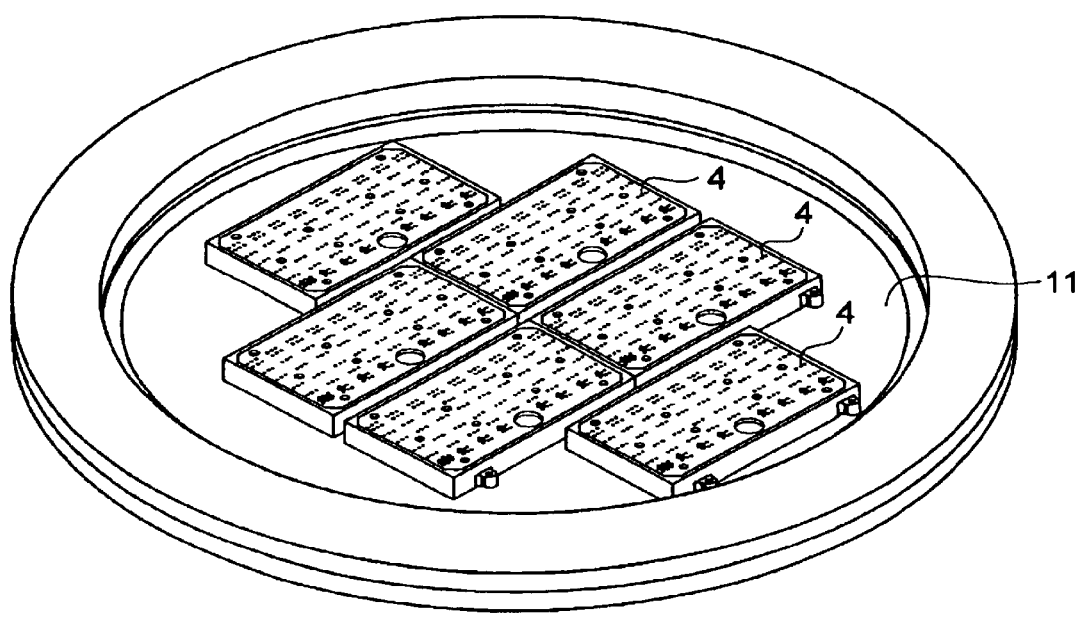
FIG. 21 is a perspective view of the state where the positioning frame has been disposed on the positioning-frame support structure of the testing apparatus, and a plurality of contactor units have been disposed on the positioning frame.

FIG. 21 is a perspective view, viewed from the upper surface direction, of the state where the positioning frame has been disposed on the positioning-frame support structure of the testing apparatus, and a plurality of contactor units have been disposed on the positioning frame.

Figure 22:
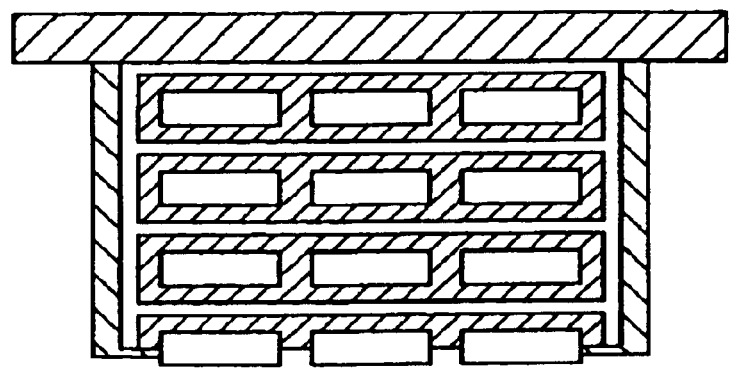
FIG. 22 is a schematic sectional view of the testing apparatus showing an example of a structure that covers a wide area in a wafer.
Figure 23:
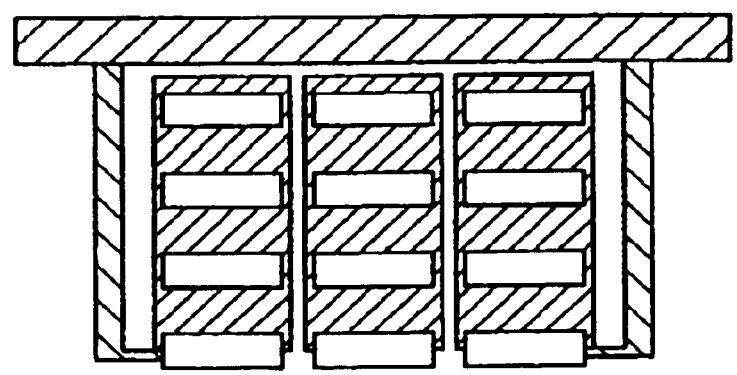
FIG. 23 is a schematic sectional view of the testing apparatus showing another example of a structure that covers a wide area in a wafer.

FIGS. 22 and 23 are schematic sectional views of the testing apparatus showing configuration examples of the unit which can be thought of when intended to accomplish structure covering a wide area in a wafer by relocating a plurality of contactors. FIG. 22 is a view showing an example wherein each of contactors, the auxiliary plate, the pin bed, and interposers provided as required is integrated for each part of the same type to be a unit (two-dimensional unit constitution); and FIG. 23 is a view showing an example wherein each part is integrated in the unit of contactors to be a unit (three-dimensional unit constitution). The present invention uses the latter three-dimensional unit constitution as is obvious from the above description. This is because the three-dimensional unit constitution is more advantageous than the two-dimensional unit constitution with respect to the following points. When there is need to use a very large number of contactors to cover the wafer to be tested, the number of parts in a unit is small, and therefore the manufacturing yield of the units is high. When a specific unit is damaged, loss by repairing is small. The flexibility of operations of each unit is high (described later with reference to FIG. 27). Difference in thermal expansion from the wafer is small.

Therefore, the present invention uses the latter three-dimensional unit constitution, and this is a feature of the present invention.

Next, The mechanical actions of the testing apparatus of the present invention will be described sequentially.

Figure 24:
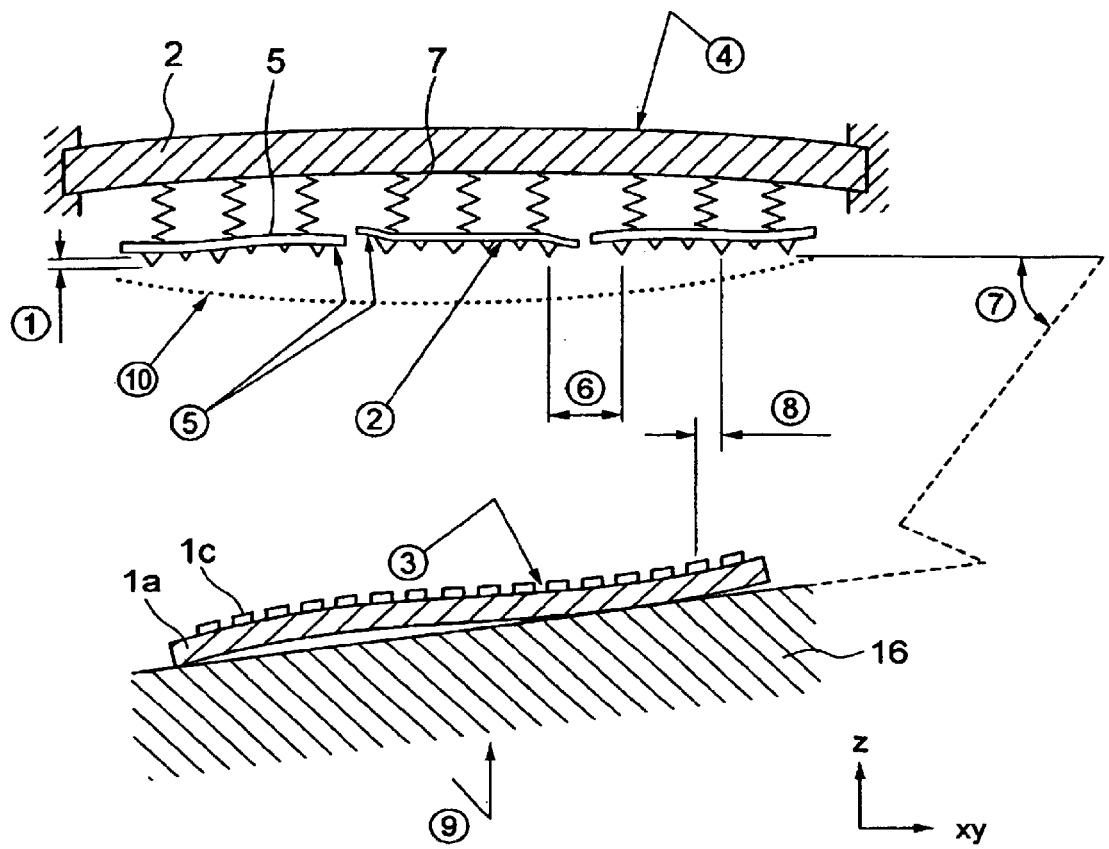
FIG. 24 is a structural concept diagram of the testing apparatus and the wafer to be tested.

FIG. 24 is a view of the structural concept of a testing apparatus and a wafer to be tested, showing the causes of the occurrence of unevenness of the pushing load between the probes, when a large area of the wafer to be tested is covered using a plurality of contactors (units) as in the present invention, and the resultant loss of required contact reliability. Therefore, in other words, the above-described objects can be achieved by solving each cause shown in FIG. 24.

First, each cause of unevenness of the pushing load will be shown in FIG. 24 (1 to 10) as follows:
(1) Individual difference of height of the probes in the contactor
(2) Unevenness (e.g., warp) of the probe-forming surface in the contactor
(3) Unevenness (e.g., warp) of the pad-forming surface of the wafer to be tested
(4) Deformation of the substrate in the z-direction (e.g., warp due to reaction force during pushing, or thermal deformation)
(5) Non-continuous variation of heights of each contactor
(6) Variation of relative positions in x- and y-directions of each contactor
(7) Relative slope of the contactor and the wafer
(8) Displacement of each probe and relevant pad in x- and y-directions accompanying thermal expansion
(9) Variation of stroke (pushing amount) of the wafer prober in the z-direction
(10) Unevenness of the contactor surface (e.g., warp of the positioning frame due to the own weight of the contactor unit)

All of these, except (6) and (9), result in apparent change of relative distance between each probe and each relevant pad, and induce the phenomenon of the variation of pushing amounts at the time of contacting (in the worst case, the pushing amount is zero, that is, contacting does not occur). The structural measures to each uneven factors in the present invention will be described in due order with reference to the drawings.

Figure 25:
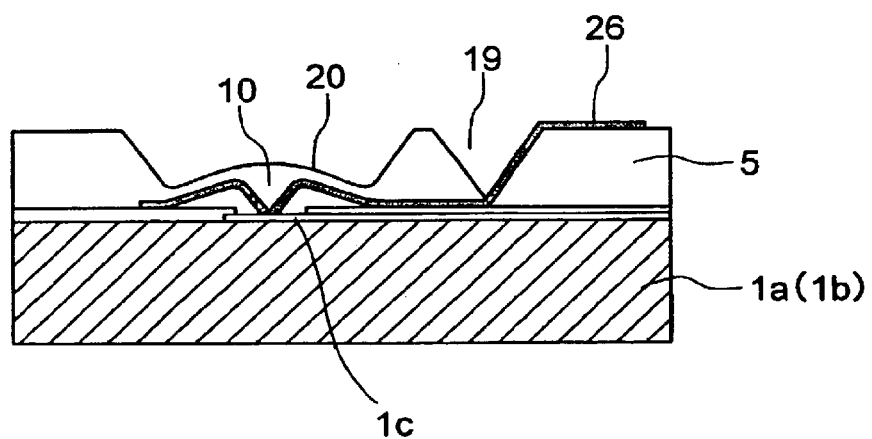
FIG. 25 is a schematic sectional view in the vicinity of the probe of the contactor.

(1) Measure to the Individual Difference of the Probe Heights in the Contactor:

FIG. 25 is a schematic sectional view of the vicinity of the probe of the contactor used in the present invention.

In the contactor 5, each probe 10 is disposed on an independent beam 20. When the probe 10 is brought into contact with the pad 1c of the wafer to be tested 1a, the beam 20 is deflected due to the load produced then as shown in FIG. 25. Therefore, even if there is individual difference in the height of each probe 10, it can be absorbed.

Figure 26:
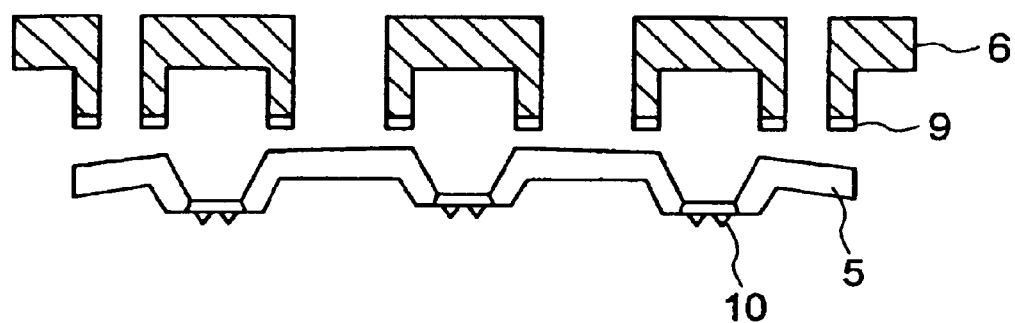
FIG. 26 is a schematic sectional view immediately before the auxiliary plate of the contactor unit is joined to the contactor.

(2) Measure to the Unevenness (e.g., Warp) of the Probe-Forming Surface in the Contactor:

FIG. 26 is a schematic sectional view of the auxiliary plate of the contactor unit used in the present invention, and the warped contactor immediately before joining.

When the contactor 5 in which a probe, a beam, and other three-dimensional elements are formed in a silicon substrate by means of etching and wiring is formed on a surface thereof as described above is used, a warp of the contactor 5 may be produced by action of partial release of residual stress previously present in the silicon wafer, which is the base material of the contactor 5, and stress produced during the process of forming wiring. Although quantity thereof depends on the shape and size of the contactor 5, it is usually several micrometers to several tens of micrometers. Since this causes the variation of apparent heights of each probe 10 as described above, this is a factor of the unevenness of contacting.

In order to avoid this, in the present invention, the contactor 5 is brought into contact with the auxiliary plate 6 whose predetermined flatness has been secured previously, and the contactor 5 is made to follow the flatness of the joining surface of the auxiliary plate 6. Thus, in the present invention, the bending rigidity of the contactor 5 is made smaller than that of the auxiliary plate 6.

Figure 27:
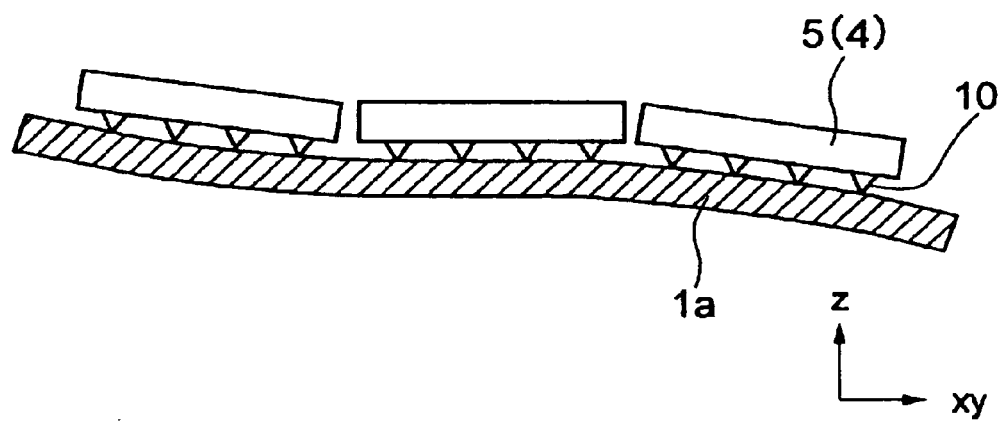
FIG. 27 is a schematic sectional view showing the state where the contactor is in contact with a warped wafer.

(3) Measure to the Unevenness (e.g., Warp) of the Pad-Forming Surface of the Wafer to be Tested:

FIG. 27 is a schematic sectional view showing the state where the contactors of the present invention are in contact with a wafer having a warp.

In the present invention, a plurality of contactors 5 are always present in a testing apparatus, and the contour of one contactor 5 is always smaller than the contour of a wafer to be tested 1a. Furthermore, each contactor 5 has the substantially independent quantity of movement in the z-direction and inclination in the state of in contact with the wafer 1a (this action will be described in detail in the description of FIGS. 30 and 31). The result means that each contactor 5 can accommodate the unevenness immediately underneath itself in the wafer to be tested 1a. In other words, by making the contour of the contactor 5 smaller than the contour of the wafer to be tested 1a, in the wafer having a macroscopic warp, the warp is apparently converted to a linear gradient of a certain value (the differential effect of the contactor 5), and the contactor 5 whose flatness has been guaranteed by the measures shown in FIG. 26 can be brought into contact at an optional gradient. Therefore, the measures of the title can be taken.

Figure 28:
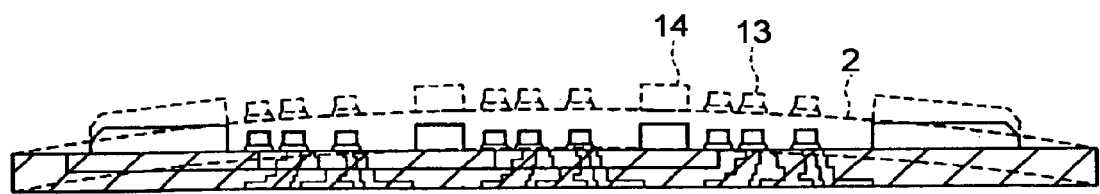
FIG. 28 is a schematic sectional view showing the state of a warped substrate.

(4) Measures to the Deformation of the Substrate in the Z-Direction (e.g., Warp Due to Reaction Force During Pushing, or Thermal Deformation):

FIG. 28 is a schematic sectional view showing the state of a substrate having a warp.

When a large number of probes in a large area are collectively brought into contact with, the sum of the required load is a value obtained by multiplying the number of probes to the value required for contacting of a single probe. For example, in a wafer of a diameter of 30 cm, the value will be as large as 1000 to 2000N. At this time, since a reaction force equal to the sum of the pushing force is applied to the substrate 2 of the testing apparatus, a considerable warp is produced in the material such as normally used glass epoxy. Since the gradient of each point in the substrate 2 accompanying the warp makes the probe height vary apparently, this is also the factor of unevenness of contacting.

Therefore, in the present invention, the auxiliary plate which is composed of a metal and a material having equivalent rigidity is partially applied to the substrate 2, to inhibit the bending deformation of the substrate.

Figure 29:
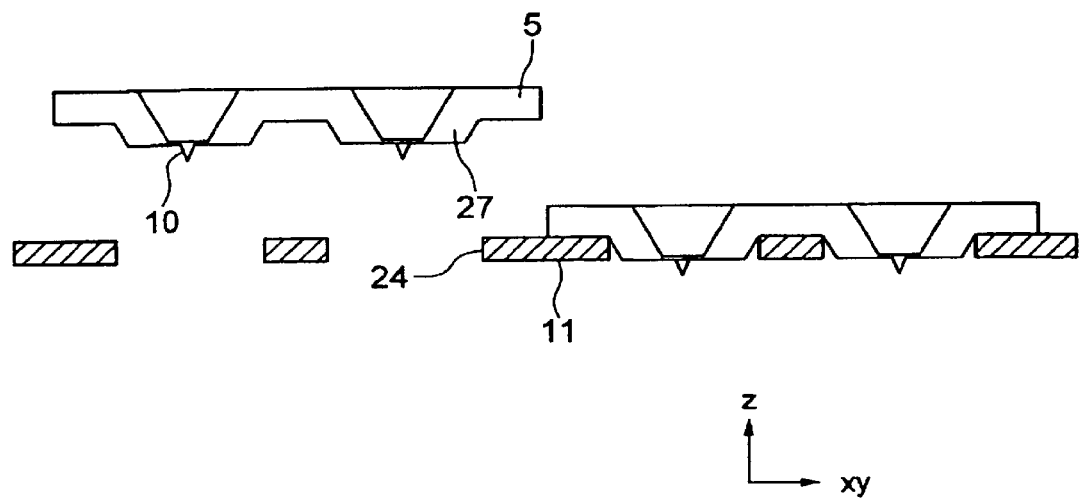
FIG. 29 is a schematic sectional view of a plurality of contactors, and a positioning frame used for relocating them.

(5) Measure to the Non-Continuous Variation of Heights of Each Contactor:

FIG. 29 is a schematic sectional view of a plurality of contactors, and a positioning frame used for the relocation of the contactors.

Each contactor 5 has a step 27 of the shape relatively coincident to the contour of the through-hole 24 of the positioning frame 11. The step 27 of the contactor 5 and the through-hole 24 of the positioning frame 11 are preferably formed mainly using an etching technique, respectively. Thereby, a higher dimensional accuracy is obtained compared with normally used machining techniques. In this state, by disposing (placing) the contactor 5 on the positioning frame 11, the height of each contactor in the z-direction is automatically determined in the stage where the both are brought into contact with each other. Here, the measure of the title becomes possible by flattening the contactor 5 with the method of FIG. 26, guaranteeing the flatness of the positioning frame 11, and specifying the step 27 of the contactor 5 at a corresponding dimensional tolerance.

(6) Measure to the Variation of Relative Positions in X- and Y-Directions of Each Contactor:

This will be described with reference to FIG. 29 again.

By the same method as in (5), the variation can be reduced to a predetermined value.

(7) Measure to the Relative Slope of the Contactor and the Wafer:

The contactor 5 and the wafer to be tested 1a have a relative gradient of the testing apparatus mounting portion of the wafer prober and the wafer stage, or a certain degree of relative gradient due to the error when the testing apparatus and the wafer to be tested are set thereto. Since this gradient causes variation in the relative distance between the probe and the relevant pad of the wafer to be tested as in the above description, it becomes the factor of unevenness of pushing.

Figure 30:
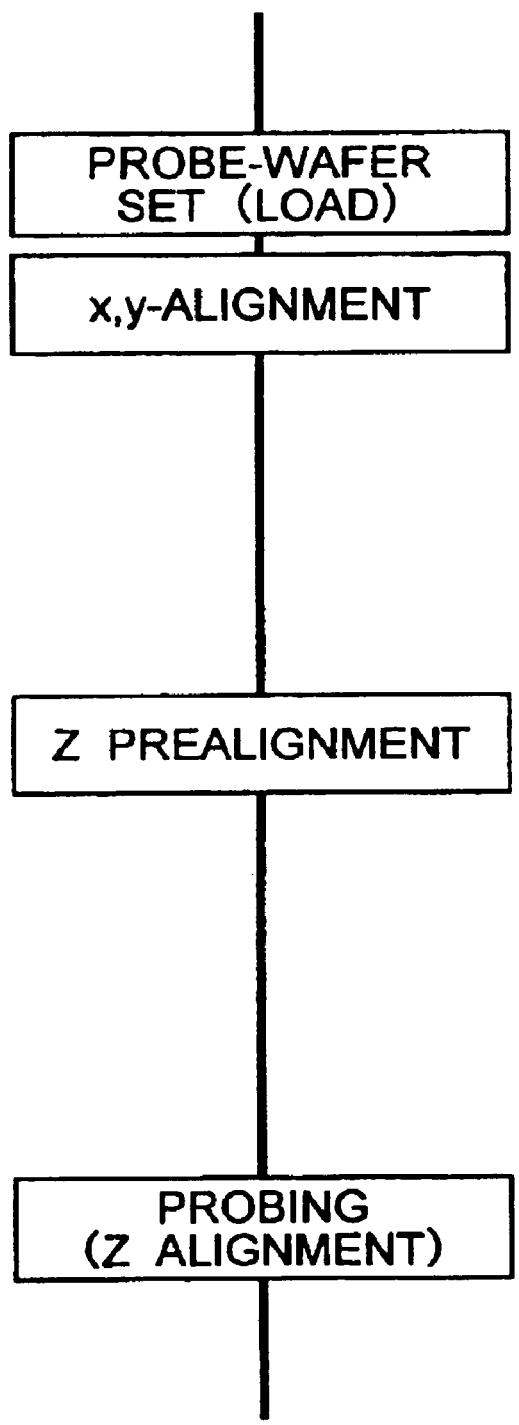
FIG. 30 is a flowchart showing the flow of mechanical actions when the testing apparatus comes in contact with the wafer to be tested.
Figure 31A:
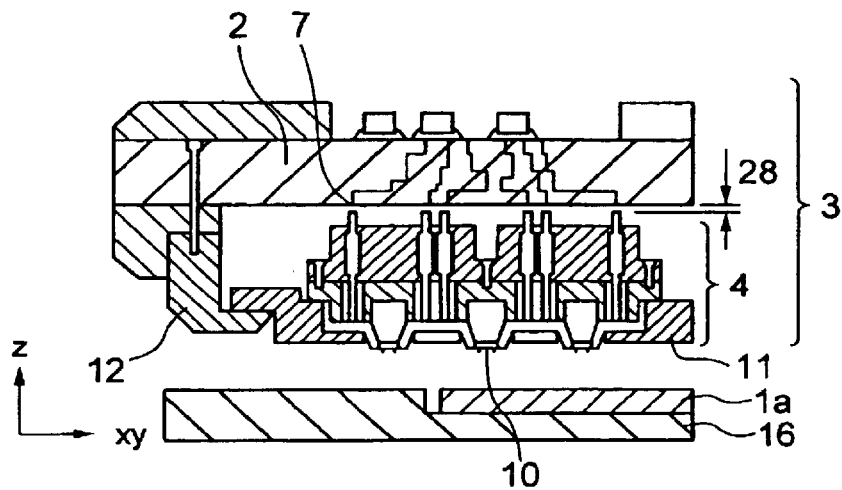
FIGS. 31(a), 31(b), and 31(c) are sectional views of major parts of the testing apparatus.
Figure 31B:
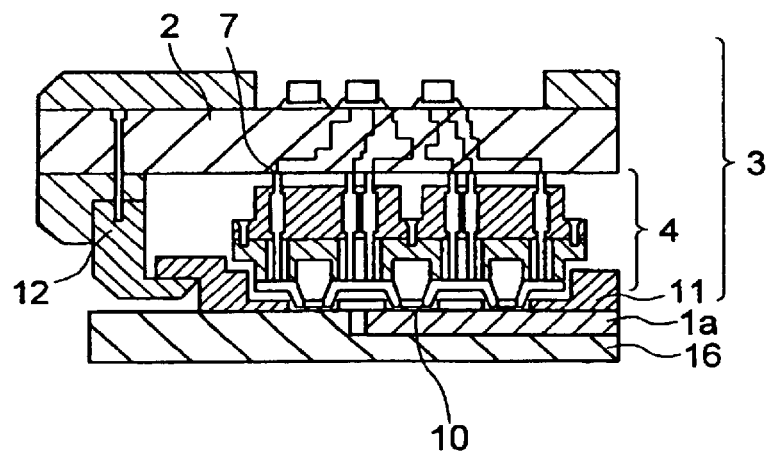
Figure 31C:
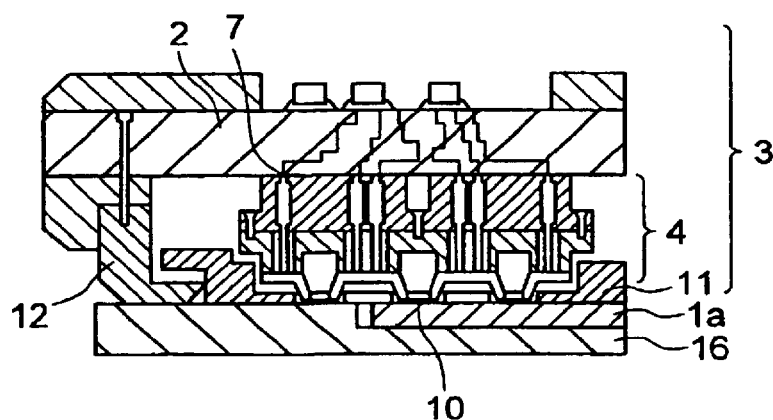

FIG. 30 is a flowchart showing the flow of structural actions when the testing apparatus of the present invention is brought into contact with the wafer to be tested; and FIGS. 31(a), (b), and (c) are sectional views of the major parts of the testing apparatus of the present invention showing the structural actions. The structural actions of the present invention will be described with reference to FIGS. 30 and 31.

A wafer to be tested is set (loaded) on a wafer prober, and the x- and y-position of the probe 10 of the testing apparatus 3 and the pad (not shown) of the wafer to be tested 1a are aligned (FIG. 31(a)).

Next, the testing apparatus 3 and the wafer stage 16 are allowed to relatively approach to each other. In general, the wafer stage 16 is moved upward.

At this time, the probe 10 first comes into contact with the wafer to be tested 1a. As a result, the contactor unit 4 is separated upward from the positioning frame 11, and the gap 28 between the substrate 2 shown in FIG. 31(a) and pogo pins 7 decreases or disappears (FIG. 31(b)). Thereby, each contactor unit 4 is temporarily fixed at an appropriate position on the wafer to be tested 1a only by the own weight and the spring force of some pogo pins 7. As a result, each contactor unit 4 is pre-aligned along the slope of the wafer 1a lying immediately under the contactor unit 4, that is, in the z-direction.

Next, the positioning frame 11 comes into contact with the wafer stage 16 or the wafer to be tested 1a. As a result, the positioning frame 11 separates from the positioning frame supporting structure 12 and pogo pins 7 come into contact with the substrate 2 by the load corresponding to the shrinkage deformation of the pogo pins 7, and the probe 10 of the contactor 5 are brought into contact (probing) with the (pads of) the wafer to be tested 1a by this load (FIG. 31(c)).

Thereby, the contactor 5 and the wafer to be tested 1a, the contactor 5 and the pogo pins 7, and the pogo pins 7 and the substrate 2 are electrically connected respectively, and the test is conducted.

As can be appreciated from a series of actions described above, in the testing apparatus of the present invention, in the state where the wafer to be tested is not in contact with the probes, there is no conduction from the probes to the substrate, and when the probes come into contact with the wafer to be tested and load by the spring force of pogo pins act inside the testing apparatus, the conduction is first secured. The reason why this action is taken will be described with reference to FIG. 32.

Figure 32:
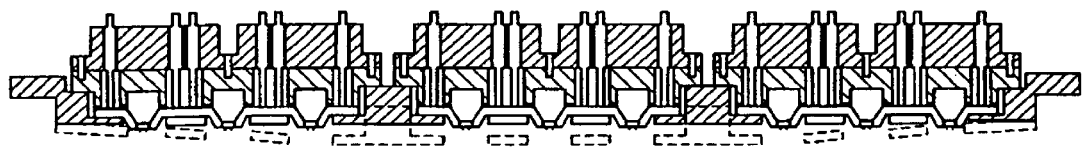
FIG. 32 is a schematic sectional view of the relevant portion showing the state where the positioning frame warps convex downward on the paper due to the own weight of the contactor unit.

FIG. 32 is a schematic sectional view of the portions in the state where the positioning frame warps convexity downward due to the own weight of the contactor unit.

To give a load necessary for conducting the inside of the testing apparatus beforehand to the inside of the testing apparatus lead to the deflection of the testing apparatus (especially the positioning frame or the substrate 2) as shown by a broken line in FIG. 32 because the load is enormous as described above. This action is taken to avoid this inconvenience.

This will further be described with reference to FIG. 33.

Figure 33:
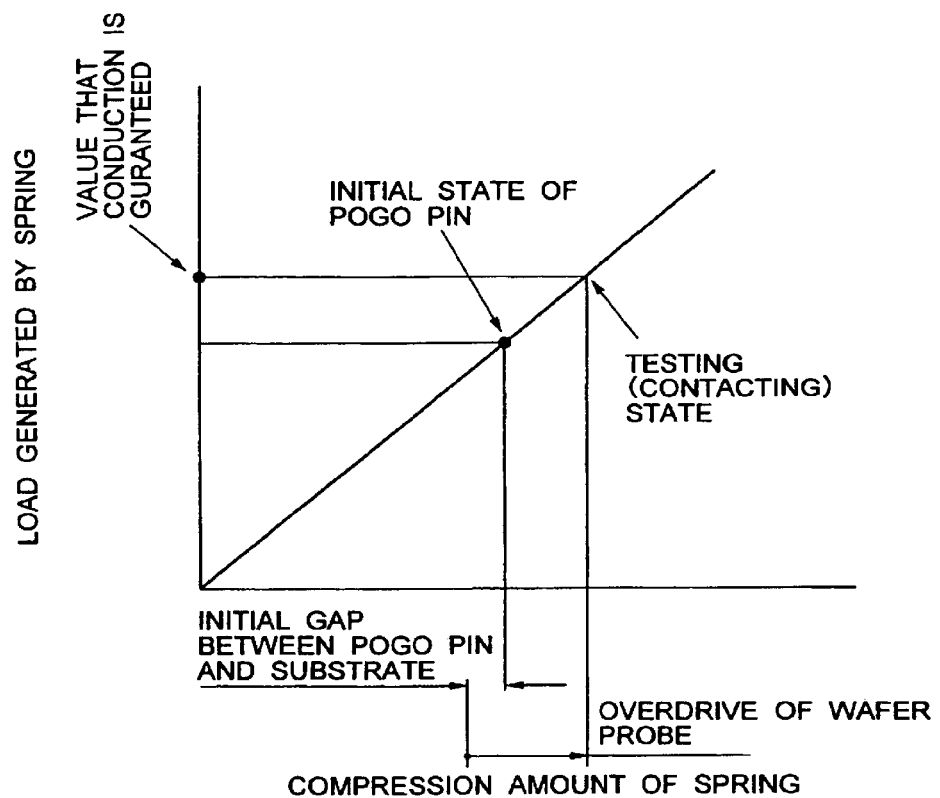
FIG. 33 is a graph showing the relationship between the compression deformation of a coil spring built in a pogo pin and the load generated by the spring.

FIG. 33 is a graph showing the relationship between the compression deformation of a coil spring built in a pogo pin used in the present invention and the load produced by the spring; and the method of use of the pogo pin in the present invention.

The spring (or spring mechanism) built in the pogo pin exhibits a linear (elastic) behavior within the range of compression deformation. In the state where the probe is not in contact with the wafer to be tested, since there is a gap between the pogo pin and the substrate, the energy of the compression deformation of the spring acts only inside the pogo pin. As a result, load applied to the testing apparatus is zero. When the probe and the wafer to be tested are relatively approached, the spring shrinks resulting in the increase of the load. By setting an amount of overdrive of the wafer prober, that is, an amount of pushing, so as to shrink the spring until the load reaches the value whereby conduction is guaranteed, the mechanical system of the testing apparatus wherein no deflection occurs initially, and conduction is obtained in the stage of testing is produced.

In the flowchart of FIG. 30, a series of operations may be performed continuously and instantaneously in which each process is not performed under the feedback control.

(8) Measure to the Displacement of Each Probe and Relevant Pad in X- and Y-Directions Accompanying Thermal Expansion:

The positioning frame can be made of a material whose coefficient of thermal expansion is a value close to the coefficient of thermal expansion of the wafer to be tested, such as 42-nickel alloy (described above with reference to FIGS. 17, 18, 19, and 20).

(9) Measure to the Variation of Stroke (Pushing Amount) of the Wafer Prober in the Z-Direction:

According to the mechanism of the present invention, the variation of load due to this phenomenon is equivalent to the value accompanying the variation of the compression deformation of the pogo pin. Therefore, if there is the possibility of this phenomenon, the spring constant of each pogo pin is decreased.

(10) Measure to the Unevenness of the Contactor Surface (e.g., Warp of the Positioning Frame Due to the Own Weight of the Contactor Unit):

The measures as described with reference to FIGS. 32 and 33 can be taken.

It can be considered to enhance the bending rigidity by making the thickness of the thick portion of the positioning frame as thick as possible.

A gap is initially formed between the substrate and the pogo pins so that no warp occurs by the spring force of the pogo pins.

Next, inconvenience other than that shown in FIG. 24, and the measures of the present invention to it will be described with reference to FIGS. 34, 35, and 36.

Figure 34:
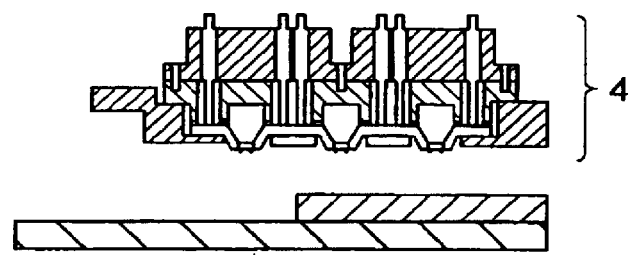
FIG. 34 is a sectional view of the major parts of a wafer stage; a wafer to be tested placed thereon, and the testing apparatus of the present invention.
Figure 35:
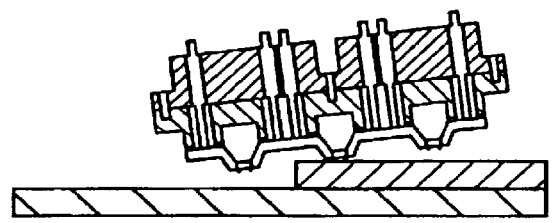
FIG. 35 is a sectional view of the major parts showing a trouble in the configuration of FIG. 34.

FIG. 34 is a sectional view of the major parts of a typical wafer stage, a wafer to be tested placed thereon, and the testing apparatus of the present invention. FIG. 35 is a sectional view of the major parts showing inconvenience in the configuration of FIG. 34. FIG. 36 is a sectional view of the major parts in the case where a wafer stage of the present invention is used.

In the testing apparatus of the present invention, substantially the same contactor units 4 are used considering interchangeability. As a result, when the plurality of contactor units 4 are to be relocated so as to cover the entire surface of the wafer to be tested, which is generally substantially circular, a part of the contactor units 4 is often protruded out of the circumference of the wafer to be tested. This does not affect the test adversely, and the protruded portion can be ignored. However, if a pushing load is exerted to the contactor unit 4 in this state, there is a case where the contactor unit 4 is tilted as shown in FIG. 35.

Figure 36:
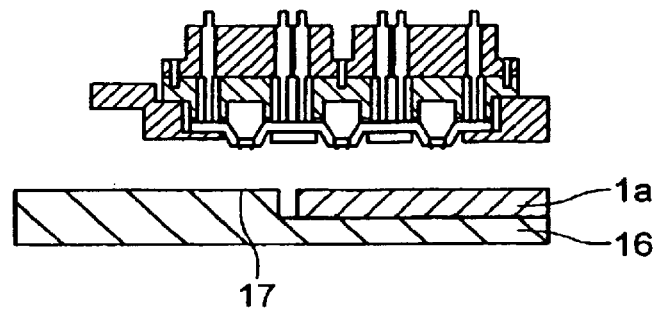
FIG. 36 is a sectional view of the major parts in the case where a wafer stage is used.

Therefore, in the present invention, in order to avoid such a phenomenon, the wafer stage 16 is furnished with a counter bore 17 of the thickness close to the thickness of the wafer to be tested 1a as shown in FIG. 36.

Next, an embodiment of contactors according to the present invention will be described.

Figure 37:
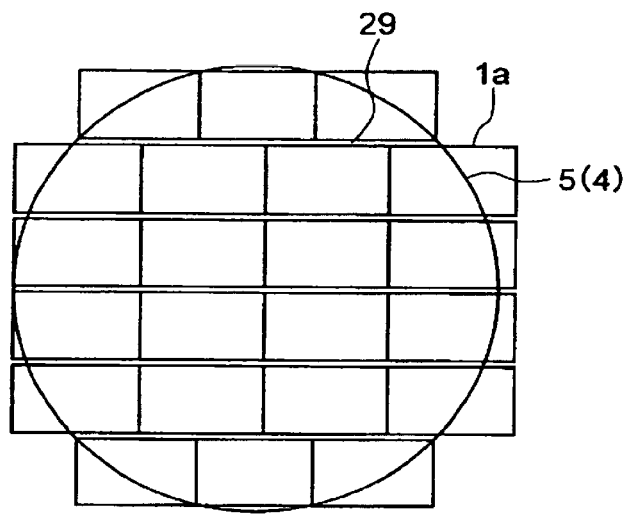
FIG. 37 is a schematic top view showing the contour of a wafer to be tested, and a plurality of contactors relocated so as to cover the entire wafer.
Figure 38:
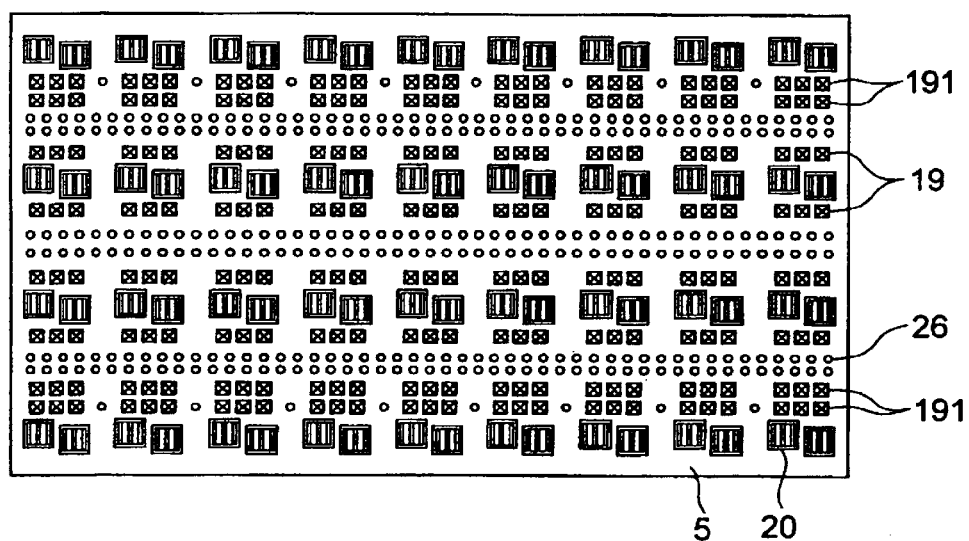
FIG. 38 is a top view showing an example of each contactor.

FIG. 37 is a schematic top view showing the contour of a wafer to be tested, and a plurality of contactors relocated so as to cover the entire wafer in a testing apparatus of the present invention. FIG. 38 is a top view showing an example of each contactor used here.

In FIG. 37, each rectangle shows the upper form of a contactor (unit), and the circular dashed line shows the upper form of a wafer to be tested. Each contactor (unit) must be made as small as possible, and a gap 29 must be secured between adjacent contactors. In the gap 29, a lib 30 for screwing the contactor unit as shown in FIG. 8 for example, and other required functions are placed. In order to minimize the number of contactors (units) used, the number of contactors (units) on the upper and lower portions of the wafer to be tested may be reduced compared with other portions. This is effective at the same time to reduce the size of the testing apparatus.

In relocating a plurality of contactors (units), it is geometrical requirement that the area of one contactor is smaller than the total area of the chip covered by the contactor. The layout for reducing the size of the contour is required for contactors. As can be appreciated from FIG. 38, although the arrangement of the beam 20 (and the probes) corresponding to the pads with which chips come into contact cannot be changed because it depends on the shape of the wafer to be tested, the layout of parts other than the contactor 5, such as through-holes 19 and secondary electrodes 26, can be changed accordingly. In the measures taken in the example of FIG. 38, the through-holes 191 in the upper and lower portions of the contactor 5 are different from the through-holes 19 present inside, and disposed inside the contactor 5. The through-holes for communicating the probes and the secondary electrodes of the contactor which is disposed at the outermost circumference take a different location from those formed in the contactor positioned inside thereof (relative location of the probes and the through-holes). The through-holes formed in the contactors positioned inside are formed on a plurality of sides of the corresponding probe. On the other hand, the through-holes formed in the contactor positioned on the outermost side are formed on one side of the corresponding probe, or on the side adjacent to the inside and outside. That is, the through-holes are preferably formed on the side other than outside.

The secondary electrodes 26 are collectively disposed on inside as much as possible so as not to be positioned on the circumferential portion of the contactors 5. As a result, the contour of a contactor 5 is smaller than the total area of chips covered by the contactor 5, and therefore, the relocation of a plurality of contactors with gaps present on substantially the same plane becomes geometrically possible.

According to the present invention, a method of manufacturing a semiconductor device that can manufacture a semiconductor device easily and efficiently by disposing a sufficient number of probes to cover an entire wide area, such as the total area of a wafer to be tested, and conducting a semiconductor testing process that can sufficiently bring the probes into contact with the wafer to be tested.

What is claimed is:

1. A testing apparatus for carrying out inspection of a semiconductor device to be tested by coming into contact with test electrodes of the semiconductor device, comprising:

a plurality of contactor units having a plurality of contactors comprising a plurality of probes that come into contact with the test electrodes of the semiconductor device to be tested and secondary electrodes electrically connected to said probes and disposed on a surface opposite to said probes;

a substrate on which electrodes electrically communicated to said contactor units by a conducting device;

a contactor-supporting member for accommodating said plurality of contactor units and supporting said contactor units in a region containing circumferential ends of said contactor units; and a supporting member to support said contactor-supporting member, the supporting member being separable from said contactor-supporting member, wherein said testing apparatus being formed to allow positional variation between said contactor and said contactor-supporting member when said contactor units come into contact with said semiconductor device to be tested.

2. A testing apparatus according to claim 1, wherein said conducting device includes a stress relaxation mechanism.

3. A testing apparatus according to claim 1, wherein said contactor-supporting member supports said contactor units so that said contactor units are moveable substantially in a vertical direction.

4. A testing apparatus according to claim 1, wherein said supporting member supports said contactor-supporting member so that said contactor-supporting member is moveable substantially in a vertical direction.

* * * * *